(12) United States Patent
Han et al.

(10) Patent No.: US 12,426,379 B2
(45) Date of Patent: Sep. 23, 2025

(54) SEMICONDUCTOR DEVICE HAVING INTERLEAVED CLOCK GATE BLOCKS AND DECOUPLING CAPACITOR BLOCKS AND METHOD OF OPERATING SAME

(71) Applicants: TAIWAN SEMICONDUCTOR MANUFACTURING COMPANY, LTD., Hsinchu (TW); TSMC NANJING COMPANY, LIMITED, Jiangsu (CN); TSMC CHINA COMPANY, LIMITED, Shanghai (CN)

(72) Inventors: Liu Han, Hsinchu (TW); Xin Yong Wang, Hsinchu (TW); Qingchao Meng, Hsinchu (TW); Huaixin Xian, Hsinchu (TW); Jing Ding, Hsinchu (TW)

(73) Assignees: TAIWAN SEMICONDUCTOR MANUFACTURING COMPANY, LTD., Hsinchu (TW); TSMC NANJING COMPANY, LIMITED, Nanjing (CN); TSMC CHINA COMPANY, LIMITED, Shanghai (CN)

( * ) Notice: Subject to any disclaimer, the term of this patent is extended or adjusted under 35 U.S.C. 154(b) by 0 days.

(21) Appl. No.: 17/406,643

(22) Filed: Aug. 19, 2021

(65) Prior Publication Data
US 2023/0029848 A1 Feb. 2, 2023

(30) Foreign Application Priority Data
Jul. 27, 2021 (CN) .......................... 202110849010.2

(51) Int. Cl.
*H10D 89/10* (2025.01)
*H03K 19/00* (2006.01)
*H10D 84/80* (2025.01)

(52) U.S. Cl.
CPC ......... *H10D 89/10* (2025.01); *H03K 19/0016* (2013.01); *H10D 84/811* (2025.01)

(58) Field of Classification Search
CPC ........................ H03K 19/0016; G11C 11/407; H10D 84/811; H10D 89/10; H01L 27/0207; H01L 27/0629; G06F 30/392
See application file for complete search history.

(56) References Cited

U.S. PATENT DOCUMENTS 9,203,405 B2   12/2015  Liu et al.
9,442,510 B2   9/2016   Tzeng et al.
(Continued)

FOREIGN PATENT DOCUMENTS

CN   106777437   5/2017
TW   202001628   1/2020
(Continued)

OTHER PUBLICATIONS

Office Action dated Aug. 12, 2022 from corresponding application No. TW 11120798970.

*Primary Examiner* — Nelson Garces
(74) *Attorney, Agent, or Firm* — Hauptman Ham, LLP

(57) ABSTRACT

A semiconductor device having a cell region, the cell region including a first set of one or more first blocks and a second set of one or more second blocks. Each of the first blocks including a clock gate and each of the second blocks includes a decoupling capacitor. The first set has two or more first blocks and/or the second set has two or more second blocks. The first blocks of the first set are interleaved with the second blocks of the second set.

20 Claims, 22 Drawing Sheets

(56) References Cited

U.S. PATENT DOCUMENTS

| | | |
|---|---|---|
| 9,887,698 B2 | 2/2018 | Liu et al. |
| 2007/0130552 A1* | 6/2007 | Inoue .................... G06F 30/392 |
| | | 716/115 |
| 2014/0082400 A1* | 3/2014 | Sprinkle ............ H03K 19/0016 |
| | | 713/500 |
| 2018/0188847 A1 | 7/2018 | Srivastava et al. |
| 2019/0081029 A1* | 3/2019 | Okamoto ............ H01L 23/5286 |
| 2019/0129488 A1 | 5/2019 | Kitaji et al. |
| 2020/0082054 A1 | 3/2020 | Shehata et al. |
| 2021/0034805 A1 | 2/2021 | Woodard et al. |
| 2022/0166427 A1* | 5/2022 | Hwang .............. H03K 19/0016 |

FOREIGN PATENT DOCUMENTS

| | | |
|---|---|---|
| TW | 202101276 | 1/2021 |
| WO | 2015053852 A1 | 4/2015 |

\* cited by examiner

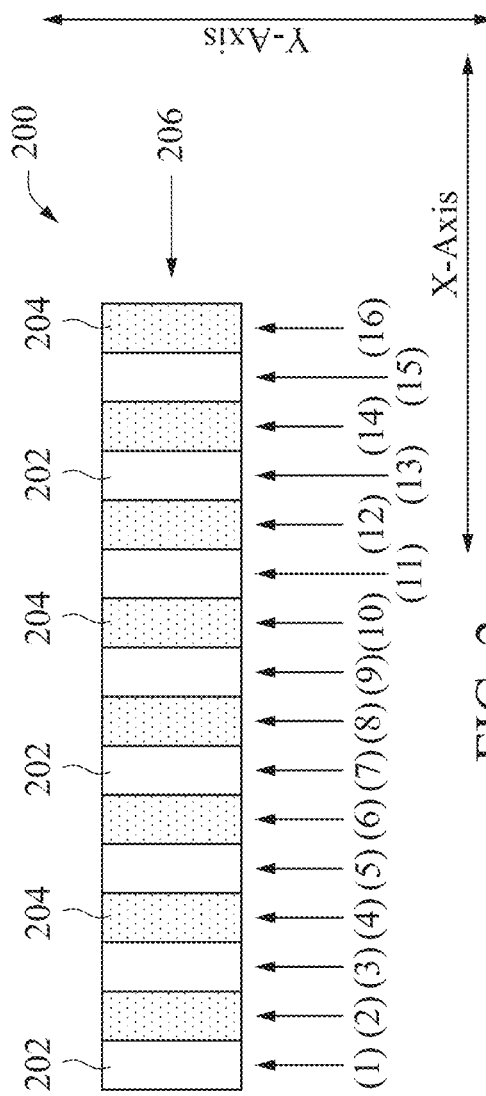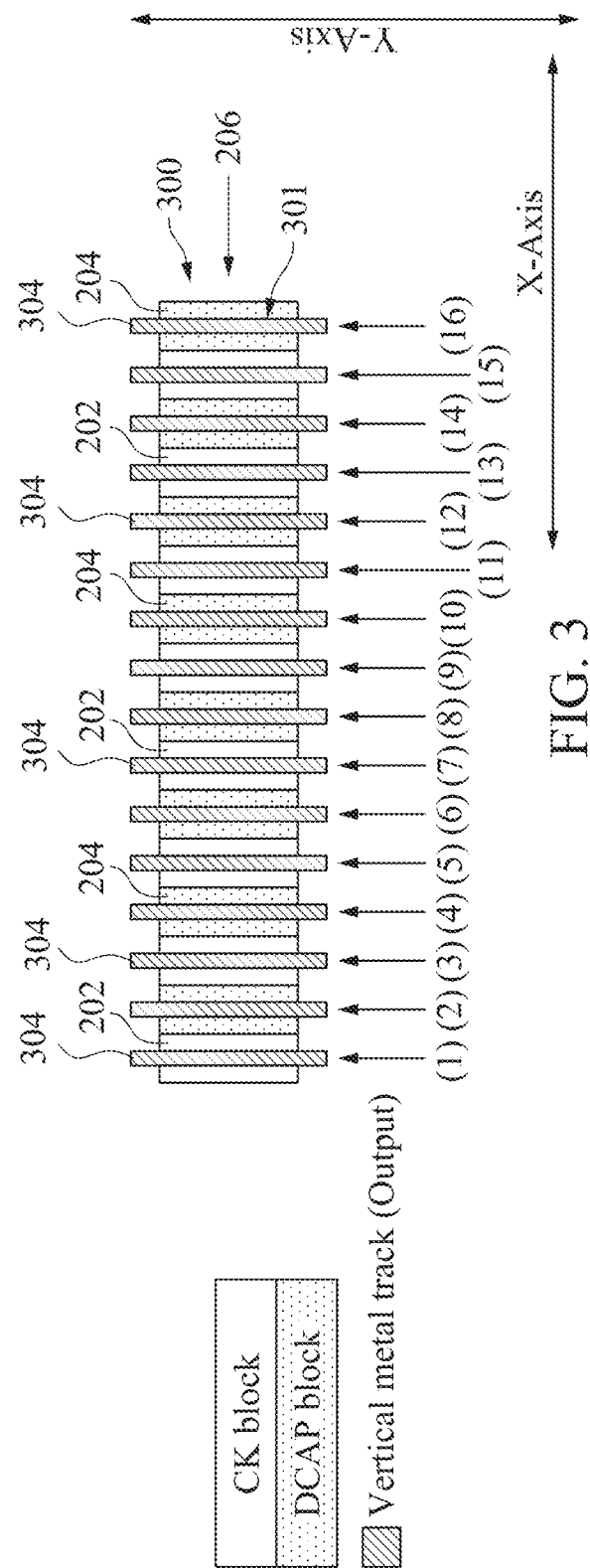

2000

2002 — form first set of one or more first blocks, each of first blocks including clock gate pattern 2004 — form second set of one or more second blocks, each of second blocks including decoupling capacitor pattern wherein at least one of first set has two or more first blocks or the second set has two or more second blocks, and first blocks of the first set are interleaved with second blocks of the second set.

FIG. 20

SEMICONDUCTOR DEVICE HAVING INTERLEAVED CLOCK GATE BLOCKS AND DECOUPLING CAPACITOR BLOCKS AND METHOD OF OPERATING SAME

PRIORITY

This application claims the priority of China Application No. 202110849010.2, filed Jul. 27, 2021, the contents of which are incorporated herein in their entirety.

BACKGROUND

In synchronized circuits, a clock tree is generally used for the purpose of distributing a clock signal to many sequential elements so that the sequential elements are timed appropriately. The sequential elements generally include flip flops, latches, and memories. The clock tree generally includes clock gates that generate gated clock signals that can be turned on and off to save power. Decoupling capacitors are connected to the clock gates in order to protect the clock gates against variations in voltage signals and ground signals from power lines. For semiconductor devices that include the clock gates, increasing the frequencies of the clock gates helps the semiconductor devices operate at faster speeds.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2 is a block diagram of a cell region, in accordance with some embodiments.

FIG. 3 is a block diagram of a cell region, in accordance with some embodiments.

FIG. 20 is a flowchart of a method of generating a layout diagram, in accordance with some embodiments.

DETAILED DESCRIPTION

Figure 1:
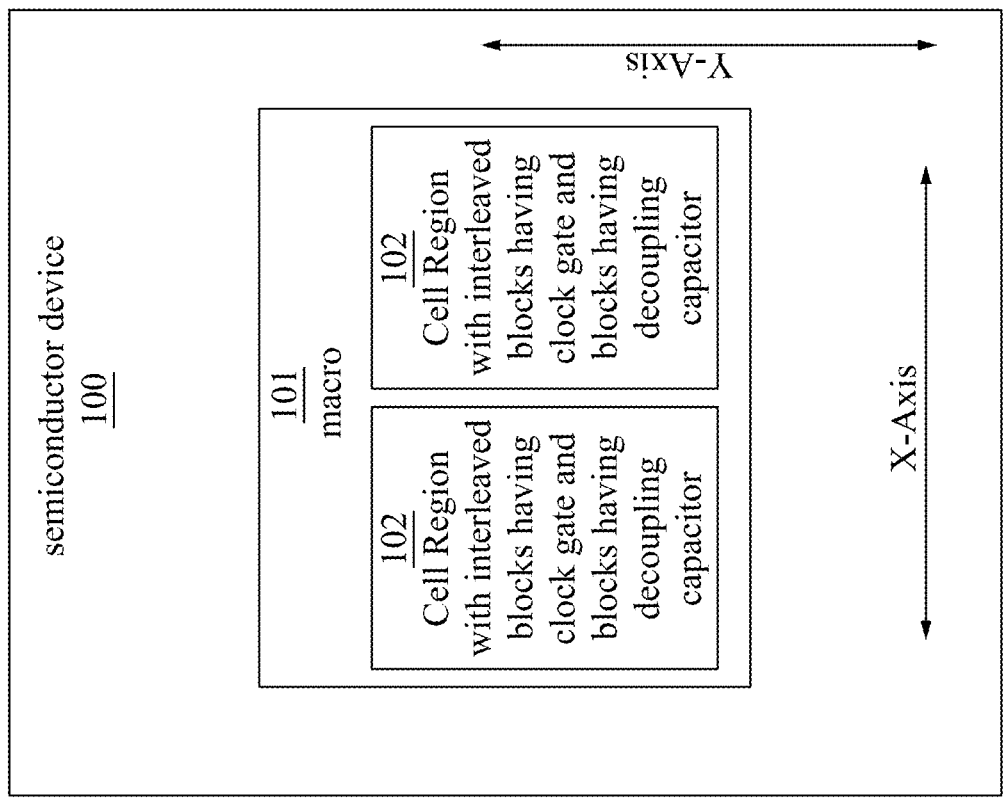
FIG. 1 is a block diagram of a semiconductor device, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of a semiconductor device and methods of manufacturing the same are disclosed. In some embodiments, the semiconductor device has at least one cell region having a set of clock gate blocks and a set of decoupling capacitor (decap) blocks. The first set has two or more first blocks and/or the second set has two or more second blocks. Each of the clock gate blocks includes a clock gate. Each of the decoupling capacitor blocks includes a decoupling capacitor. Within each cell region, the clock gate blocks and the decoupling capacitor blocks are interleaved. According to another approach, within each cell region, clock gate blocks and decap blocks are segregated from each other, i.e., are not interleaved. For example, according to the other approach two or more clock gate blocks are not separated by one or more decap blocks, nor are two or more decap blocks separated by one or more clock gate blocks. Typically, much more current flows through clock gate blocks than flows through decap blocks. The segregation of clock gate blocks from decap blocks in a cell region according to the other approach tends to concentrate current in the portion of the cell region where the clock gate blocks are located. The concentration of current in the clock gate block portion of the cell region according to the other approach makes the other approach more susceptible to problems such as self-heating, electromigration, or the like.

Interleaving the clock gate blocks and the decap blocks within a cell region according to some embodiments is advantageous because higher-current-flow conductors, i.e., one or more conductors in each clock gate block, included in in the cell region are distributed more evenly in the cell region as compared to the other approach. The more even distribution of higher-current-flow conductors in a cell region according to some embodiments reduces susceptibility to problems such as self-heating, electromigration, or the like, thereby facilitating more efficient and/or faster operation of clock gates included in the clock gate blocks.

FIG. 1 is a block diagram of a semiconductor device 100, in accordance with some embodiments.

In FIG. 1, semiconductor device 100 includes, among other things, a circuit macro (hereinafter, macro) 101. Macro 101 includes cell regions 102. Each cell region 102 includes a first set of one or more clock gate blocks and a second set of one or more decoupling capacitance/capacitor (decap) blocks. The first set has two or more clock gate blocks and/or the second set has two or more decap blocks.

Each clock gate block includes one or more clock gates which generate corresponding gated clock signals. In some embodiments, the generation of clock signals is turned on and off by a clock enable signal. In some embodiments, clock gates are also used to provide a delay in the clock signal so that sequential state elements (not shown) in different portions of macro 101 and/or semiconductor device 100 are synchronized appropriately. In some embodiments, sequential state elements are responsive to clock edges (e.g., positive clock edge or negative clock edge) of a clock signal, and clock gates are used to manipulate clock edges and thereby coordinate operation of the sequential state elements. Some common types of clock gates include negative-latch-AND gate based clock gates, OR gate based clock gate, positive-latch-OR-gate based clock gates, and AND-gate based clock gates. Examples of clock gates are provided in U.S. Pat. No. 9,887,698, which issued on Feb. 6, 2018, U.S. Pat. No. 9,203,405, which issued on Dec. 1, 2015, and U.S. Pat. No. 9,442,510, which issued on Sep. 14, 2016, each of which are incorporated by reference in their entirety.

Decoupling capacitors are used to decouple (at least with respect to certain portions of the frequency spectrum) the clock gates from other circuits in semiconductor device 100. Again, decoupling capacitors protect against variations in voltage signals and ground signals from power lines. In some embodiments in which the protected circuit (e.g., a clock gate) has a first node that would otherwise be electrically coupled to a power rail (e.g., a VDD rail, a VSS rail, a ground rail, or the like), one or more decoupling capacitors are electrically coupled between the node and the power rail. The one or more decoupling capacitors provide corresponding charge reservoirs that help to maintain low impedance, to reduce power noise, to maintain the integrity of the gated clock signal, or the like.

Each decap block includes one or more capacitors. In some embodiments, a capacitor in a decap block is a Negative Metal Oxide Semiconductor (NMOS) field-effect transistor (FET) having a capacitor configuration in which drain and source terminals of the NMOS FET (NFET) are electrically coupled together. In some embodiments, a capacitor in a decap block is a pair of an NFET and a Positive Metal Oxide Semiconductor (PMOS) FET (PFET) electrically coupled in series, and wherein a gate terminal of the PFET is electrically coupled to a drain terminal of the NFET, and a gate terminal of the NFET is electrically coupled to a drain terminal of the PFET.

Within each cell region 102, as mentioned above, the clock gate blocks (which have the clock gates) are interleaved with the decap blocks (which have the decoupling capacitors). Thus, at least one clock gate block is provided between decap blocks and/or at least one decap block is between clock gate blocks. In some embodiments, interleaving of the clock gate blocks and the decap blocks results in currents that are more uniformly distributed as compared to the other approach and/or results in less current accumulation in conductors of cell regions 102 as compared to the other approach. In some embodiments, the cell region includes metal layers, wherein conductors in one metal layer extend in a first direction that is parallel to the X-axis and conductors in another metal layer extend in a second direction that is parallel to the Y-axis. As such, the first direction is perpendicular to the second direction. By interleaving clock gate blocks with decap blocks within a cell region, self-heating is reduced within the cell region because the clock gate blocks are not concentrated in one area, i.e., are not segregated from the decap blocks as compared to the other approach. In some embodiments, the conductors in each instance of cell region 102 are more uniformly distributed and shorter as compared to the other approach, therefore allowing for more uniform flow of current throughout cell regions 102.

In some embodiments, boundaries of cell regions 102 are identified by dummy gates, dummy source/drain regions, and/or dummy conductors. In some embodiments, boundaries of cell regions 102 are identified by power rails (e.g., VDD rails or ground rails). In some embodiments, boundaries of cell regions are identified by comparing semiconductor device 100 to a layout diagram. Cells in the layout diagram correspond to cell regions in semiconductor device 100. In some embodiments, boundaries of cell regions 102 are identified by finding locations in semiconductor device 100 that do not include certain types of interconnects. In some embodiments, boundaries are identified by empty space or dummy regions. Details regarding identifying boundaries of cell regions in a semiconductor device are disclosed in, e.g., U.S. Pre-Grant Publication No. 20200082054, which published on Mar. 12, 2020, U.S. Pre-Grant Publication No. 20210034805, which published on Feb. 4, 2012, and International (WO) Pre-Grant Publication No. 2015053852, which has priority to International Application No. PCT/US2014/050180, and which published on Apr. 16, 2015, the entireties of each of which are hereby incorporated by reference.

FIG. 2 is a block diagram of a cell region 200, in accordance with some embodiments.

Cell region 200 is an example of a corresponding one of cell regions 102 in FIG. 1.

Cell region 200 includes a set of clock gate blocks 202 and a set of decap blocks 204. Each clock gate block is shown as a white block in FIG. 2 though not all of the white blocks are labeled 202 for the sake of simplicity of illustration. Each decap block is shown as a shaded block in FIG. 2 though not all of the shaded blocks are labeled 204 for the sake of simplicity of illustration. Clock gate blocks 202 and decap blocks 204 are interleaved in FIG. 2.

In FIG. 2, clock gate blocks 202 and decap blocks 204 are arranged in a row 206 of blocks with respect to the X-axis. Positions of the blocks in row 206 are identified by a parenthetical integer, i.e., an integer enclosed by a parenthesis ( ) where the integer increases from left to right as (e.g., position (1) identifies the leftmost position in row 206). In this example, each block in row 206 that is in an odd-numbered position is an instance of clock gate block 202 (e.g., the block at position (1) is an instance of clock gate block 202) and each block in row 206 in an even-numbered position is an instance of decap block 204 (e.g., the block at position (2) is an instance of decap block 204). In some embodiments, the parenthetical integers correspond to track lines of a corresponding layout diagram. For the sake of convenience, this embodiment is referred to as an odd-even row.

In odd-even row of FIG. 2, row 206 has sixteen blocks. In other embodiments, row 206 includes a number of blocks less than sixteen or greater than sixteen. Accordingly, embodiments of row 206 include N number of blocks where N is an integer greater than 2. In other embodiments (not shown), each block in row 206 that is in an even-numbered position is an instance of clock gate block 202 (e.g., the block at position (2) would be an instance of clock gate block 202) and each block in row 206 in an odd-numbered position is an instance of decap block 204 (e.g., block at position (1) would be a decap block 204). In this alternative example, white blocks would be decap blocks 204 and clock gate blocks 202 would be the shaded blocks. Such other embodiments referred to as having an even-odd row.

Referring again to the embodiment shown in FIG. 2, except for clock gate block 202 at position (1) and decap block 204 at position (16), each clock gate block 202 is between adjacent decap blocks 204, and each decap block 204 is between clock gate blocks 202.

FIG. 3 is a block diagram of a cell region 300, in accordance with some embodiments.

Cell region 300 is an example of a corresponding one of cell regions 102 in FIG. 1. Furthermore, cell region 300 includes the same arrangement of clock gate blocks 202 and decap blocks 204 described above with respect to FIG. 2. Thus, cell region 300 also includes row 206 of blocks, as described above with respect to FIG. 2.

In this embodiment, cell region 300 includes a metal layer 301. Examples of metal layer 301 include metal layer M0, metal layer M1, metal layer M2, and/or the like. Metal layer 301 includes conductors 304 (not all of which are labelled for the sake of simplicity of illustration in FIG. 3). Each of conductors 304 has a long axis that extends parallel to the Y-axis. Each of conductors 304 extends over a corresponding one of the blocks in row 206 of blocks. More specifically, a corresponding one of conductors 304 extends over each one of clock gate blocks 202 and a corresponding one of conductors 304 extends over each one of decap blocks 204.

Because decap blocks 204 separate clock gate blocks 202 with a result that clock gate blocks 202 are more uniformly distributed as compared to the other approach, accordingly conductors 304 are more uniformly distributed as compared to the other approach. Due to the more uniform distribution of conductors 304, current is more uniformly distributed through cell region 300 as compared to the other approach, which fortifies cell region 300 against problems such as self-heating, electromigration, or the like.

Figure 4:
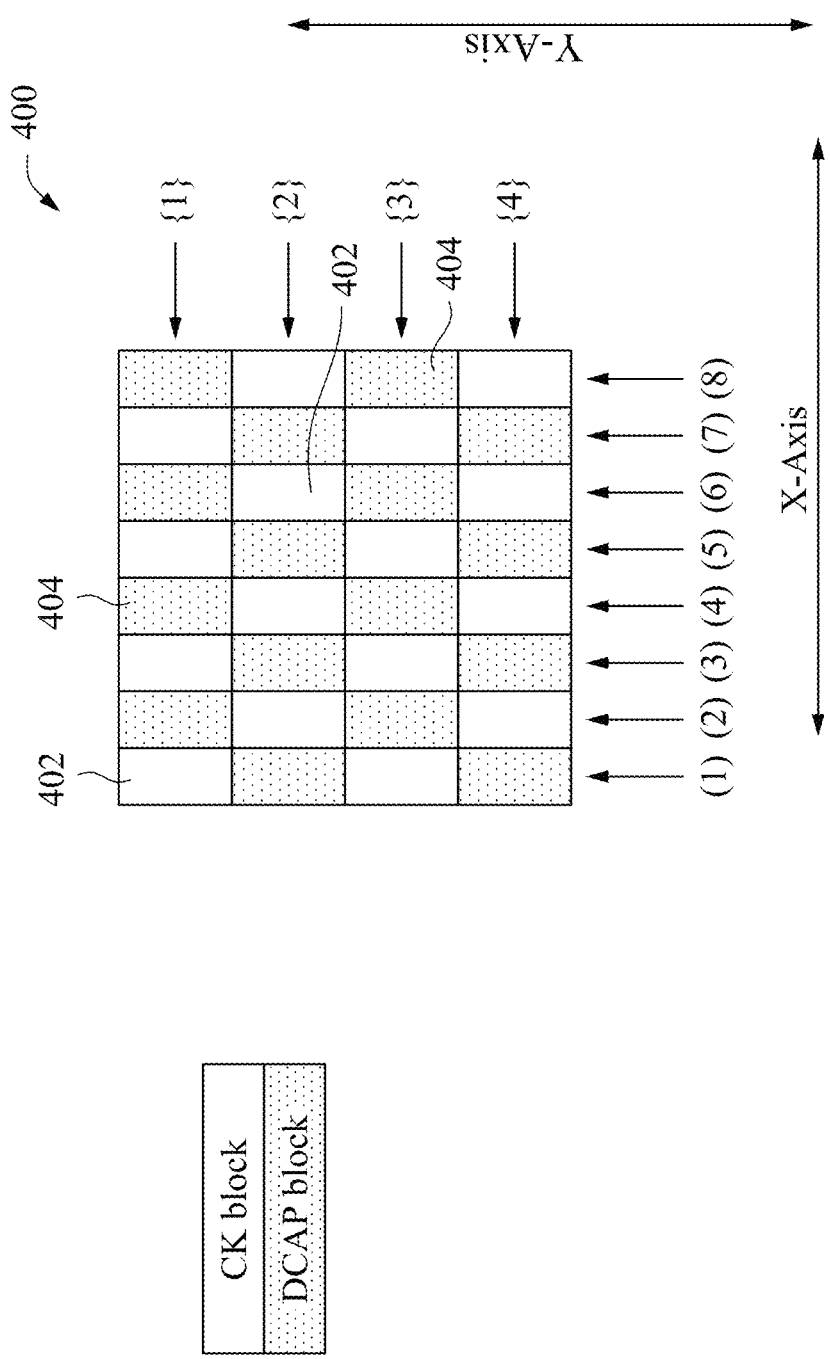
FIG. 4 is a block diagram of a cell region, in accordance with some embodiments.

FIG. 4 is a block diagram of a cell region 400, in accordance with some embodiments.

Cell region 400 is an example of a corresponding one of cell regions 102 in FIG. 1.

Each clock gate block is shown as a white block in FIG. 4 though not all of the white blocks are labeled 402 for the sake of simplicity of illustration. Each decap block is shown as a shaded block in FIG. 4 though not all of the shaded blocks are labeled 404 for the sake of simplicity of illustration. Clock gate blocks 402 and decap blocks 404 are interleaved in FIG. 4, and have a two-dimensional checkerboard pattern.

In FIG. 4, clock gate blocks 402 and decap blocks 404 are arranged in rows with respect to the X-axis and in columns with respect to the Y-axis. Rows are identified by an integer in brackets { } where the integer increases from top to bottom. Columns are identified by an integer in parentheses ( ) that increases from left to right. If N is an integer that identifies a total number of rows and M is an integer that identifies a total number of columns, then one of either N or M is greater than or equal to 3, i.e., 3≤N and 3≤M, and the other integer is greater than or equal to 2. For example, N=3 and M=2. For example, M=3 and N=2. The reason that at least one of M or N is greater than 2 is because at least 3 consecutive blocks are needed with the pattern shown in FIG. 4 to get interleaving of clock gate blocks 402 and decap blocks 404. In FIGS. 4, N=4 and M=8.

In FIG. 4, each block in row {1} that is in an odd-numbered column position is one of clock gate blocks 402 and each block in row {1} in an even-numbered column position is one of decap blocks 404. More specifically, block {1}(1), block {1}(3), block {1}(5), block {1}(7) are each a corresponding clock gate block 402 and block {1}(2), block {1}(4), block {1}(6), block {1}(8) are each a corresponding decap block 404. The arrangement of row {1} is referred to as an odd-even row.

In FIG. 4, each block in row {2} that is in an even-numbered column position is one of clock gate blocks 402 and each block in row {2} in an odd-numbered column position is one of decap blocks 404. More specifically, block {2}(1), block {2}(3), block {2}(5), block {2}(7) are each a corresponding decap block 404 and block {2}(2), block {2}(4), block {2}(6), block {2}(8) are each a corresponding clock gate block 402. The arrangement of row {2} is referred to as an even-odd row.

In FIG. 4, each row in an odd-numbered row position is an odd-even row and each row in an even-numbered row position is an even-odd row. Accordingly, in this embodiment, row {3} is an odd-even row and row {4} is an even-odd row. Thus, except for blocks in column position (1) and in column position (8), each of clock gate blocks 402 in the rows is between a pair of decap blocks 404 and each decap block 404 is between a pair of clock gate blocks 402. Thus, blocks in each of rows {1}, {2}, {3}, {4} are interleaved with respect to the X-axis.

Referring again to the embodiment shown in FIG. 4, except for clock gate block 402 at column position (1) and decap block 404 at column position (8), each clock gate block 402 is between adjacent decap blocks 404 and each decap block 404 is between clock gate blocks 402.

In FIG. 4, each block in column (1) that is in an odd-numbered row position is one of clock gate blocks 402 and each block in column (1) in an even-numbered row position is one of decap blocks 404. More specifically, block {1}(1), block {3}(1) are each a corresponding clock gate block 402 and block {2}(1), block {4}(1), are each a corresponding decap block 404. The arrangement of column (1) is referred to as an odd-even column.

In FIG. 4, each block in column (2) that is in an even-numbered row position is one of clock gate blocks 402 and each block in column (2) in an odd-numbered row position is one of decap blocks 404. More specifically, block {1}(2), block {3}(2) are each a corresponding decap block 404 and block {2}(2), block {4}(2), are each a corresponding clock gate block 402. The arrangement of column (2) is referred to as an even-odd column.

In FIG. 4, each column in an odd-numbered column position is an odd-even column and each column in an even-numbered column position is an even-odd column. Accordingly, in this embodiment, columns {3}, {5}, {7} are each an odd-even column and columns {4}, {6}, {8} are each an even-odd column. Thus, except for blocks in row position {1} and in row position {4}, each of clock gate blocks 402 in the columns is between a pair of decap blocks 404 and each decap block 404 is between a pair of clock gate blocks 402. Thus, blocks in each of columns (1), (2), (3), (4), (5), (6), (7), (8) are interleaved with respect to the Y-axis.

The embodiment shown in FIG. 4, each row in an odd-numbered row position is an odd-even row, each row in an even-numbered row position is an even-odd row, each column in an odd-numbered column position is an odd-even column, and each column in an even-numbered column position is an even-odd column. The embodiment shown in FIG. 4 is referred to as a type A cell region 400.

In an alternative embodiment (not shown), each row in an odd-numbered row position is an even-odd row, each row in an even-numbered row position is an odd-even row, each column in an odd-numbered column position is an even-odd column, and each column in an even-numbered column position is an odd-even column. This alternative embodiment is referred to as a type B cell region 400. Both type A cell region 400 and type B cell region 400 have a checkerboard pattern.

Figure 5:
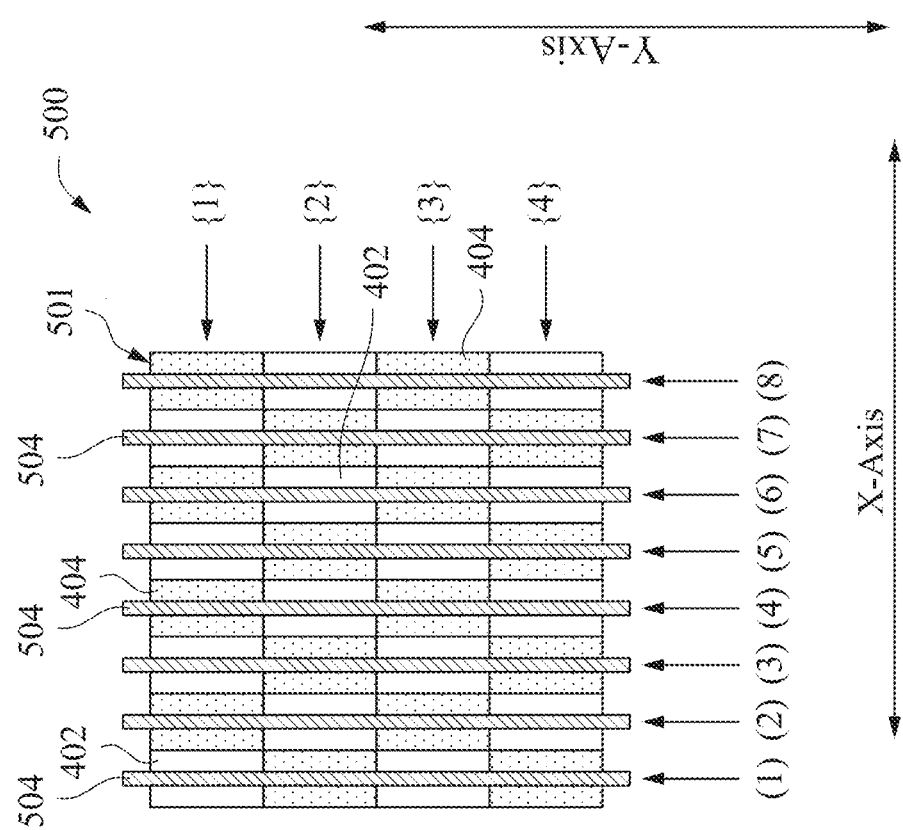
FIG. 5 is a block diagram of a cell region, in accordance with some embodiments.

FIG. 5 is a block diagram of a cell region 500, in accordance with some embodiments.

Cell region 500 is an example of a corresponding one of cell regions 102 in FIG. 1. Furthermore, cell region 500 includes the same arrangement of clock gate blocks 402 and decap blocks 404 described above with respect to FIG. 4. Thus, cell region 500 also includes rows of blocks, as described above with respect to FIG. 4.

In this embodiment, cell region 500 includes a metal layer 501. Examples of metal layer 501 include metal layer M0, metal layer M1, metal layer M2, and/or the like. Metal layer 501 includes conductors 504 (not all of which are labelled for the sake of simplicity of illustration in FIG. 5). Each of conductors 504 has a long axis that extends parallel to the Y-axis. Each of conductors 504 extends over a corresponding one of columns (1)-(8).

Because decap blocks 404 separate clock gate blocks 402 with a result that clock gate blocks 402 are uniformly distributed as compared to the other approach, accordingly, conductors 504 are more uniformly distributed as compared to the other approach. Due to the more uniform distribution of conductors 504, current is more uniformly distributed through cell region 500 as compared to the other approach, which fortifies cell region 500 against problems such as self-heating, electromigration, or the like.

Figure 6:
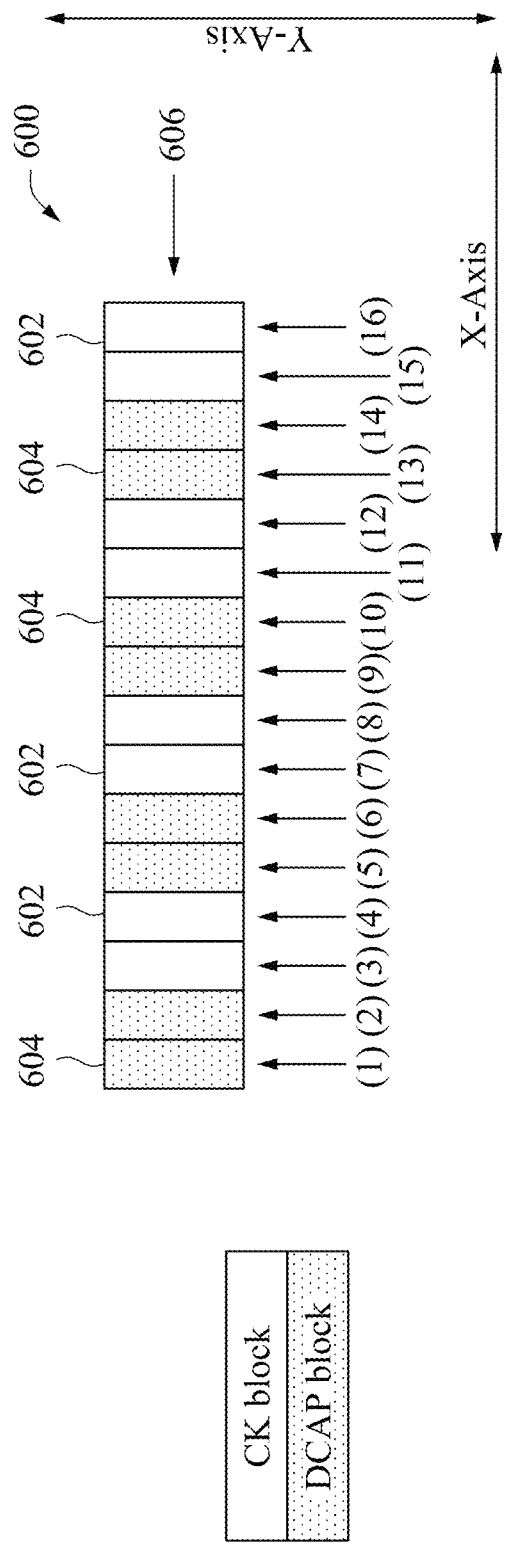
FIG. 6 is a block diagram of a cell region, in accordance with some embodiments.

FIG. 6 is a block diagram of a cell region 600, in accordance with some embodiments.

Cell region 600 is an example of a corresponding one of cell regions 102 in FIG. 1.

Each clock gate block is shown as a white block in FIG. 6 though not all of the white blocks are labeled 602 for the sake of simplicity of illustration. Each decap block is shown as a shaded block in FIG. 6 though not all of the shaded blocks are labeled 604 for the sake of simplicity of illustration. Clock gate blocks 602 and decap blocks 604 are interleaved in FIG. 6. In FIG. 6, clock gate blocks 602 and decap blocks 604 are arranged in a row 606 of blocks with respect to the X-axis. Positions of the blocks in row 606 are identified by an integer between parenthesis ( ) where the integer increases from left to right as (e.g., position (1) identifies the left most position in row 606).

FIG. 6 has a paired arrangement of blocks. More particularly, the blocks alternate between groups of two adjacent clock gate blocks 602 and groups of two adjacent decap blocks 604. In this example, groups of two are started with two adjacent decap blocks 604 and ends with two adjacent clock gate blocks 602. Starting with position (1) and position (2), each group of two adjacent decap blocks 604 is separated by two block positions. Thus, blocks at position (1), position (2), position (5), position (6), position (9), position (10), position (13), and position (14) are each decap blocks 604. Starting with position (3) and position (4), each group of two clock gate blocks 602 is separated by two block positions. Thus, blocks at position (3), position (4), position (7), position (8), position (11), position (12), position (15), position (16) are each clock gate blocks 602. For the sake of convenience, this embodiment is referred to as an even-odd group of 2 row.

In this embodiment, row 606 has sixteen blocks. In other embodiments, row 606 includes a number of blocks less than sixteen or greater than sixteen. Accordingly, embodiments of row 606 include N number of blocks where N is an integer greater than 5. This is because, with the pattern shown in row 606, at least 6 blocks are needed to provide interleaving. In an alternative embodiment, starting with position (1) and position (2), each group of two adjacent clock gate blocks 602 is separated by two block positions. Thus, blocks at position (1), position (2), position (5), position (6), position (9), position (10), position (13), position (14) would each be clock gate blocks 602. Starting with position (3) and position (4), each group of two decap blocks 604 is separated by two block positions. Thus, blocks at position (3), position (4), position (7), position (8), position (11), position (12), position (15), and position (16) are each decap blocks 604. For the sake of convenience, this alternative embodiment is referred to as an odd-even group of 2 row.

Referring again to the embodiment shown in FIG. 6, except for clock gate blocks 602 at positions (15), (16), each group of two adjacent clock gate blocks 602 is between two groups of two adjacent decap blocks 604. Additionally, except for two adjacent decap blocks 604 at positions (1), (2) each group of two adjacent decap block 604 is between two groups of two adjacent clock gate blocks 602.

Figure 7:
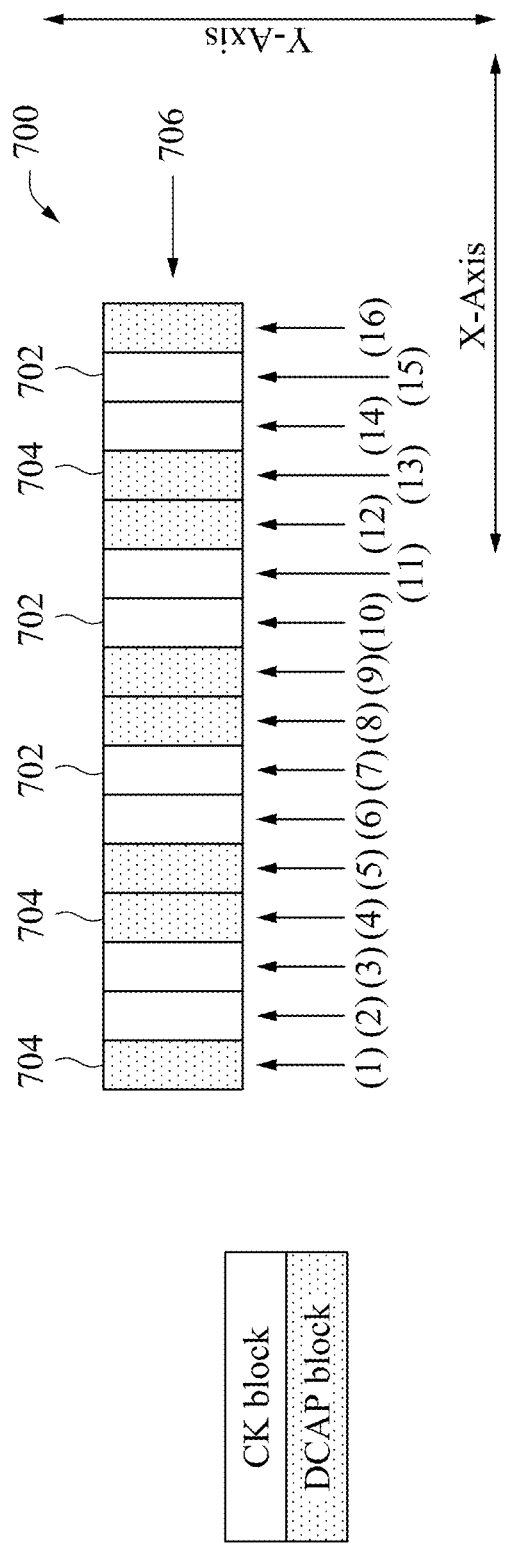
FIG. 7 is a block diagram of a cell region, in accordance with some embodiments.

FIG. 7 is a block diagram of a cell region 700, in accordance with some embodiments.

Cell region 700 is an example of a corresponding one of cell regions 102 in FIG. 1.

Each clock gate block is shown as a white block in FIG. 7 though not all of the white blocks are labeled 702 for the sake of simplicity of illustration. Each decap block is shown as a shaded block in FIG. 7 though not all of the shaded blocks are labeled 704 for the sake of simplicity of illustration. Clock gate blocks 702 and decap blocks 704 are interleaved in FIG. 7. In FIG. 7, clock gate blocks 702 and decap blocks 704 are arranged in a row 706 of blocks with respect to the X-axis. Positions of the blocks in row 706 are identified by an integer between parenthesis ( ) where the integer increases from left to right as (e.g., position (1) identifies the leftmost position in row 706).

FIG. 7 is a variation of the paired arrangement of blocks shown in FIG. 6. More particularly, in FIG. 7, at each of end position (1) and end position (16), cell region 700 includes a single unpaired decap block 704. At positions (2)-(15), the blocks alternate between groups of two adjacent clock gate blocks 702 and groups of two adjacent decap blocks 704. Accordingly, position (1), position (4), position (5), position (8), position (9), position (12), position (13), position (16), each include a corresponding one of decap blocks 704. Thus, blocks at position (1), position (4), position (5), position (8), position (9), position (12), position (13), and position (16) are each decap blocks 704. Furthermore, position (2), position (3), position (6), position (7), position (10), position (11), position (14), position (15) are clock gate blocks 702.

In this embodiment, row 706 has sixteen blocks. In other embodiments, row 706 includes a number of blocks less than sixteen or greater than sixteen. Accordingly, embodiments of row 706 include N number of blocks where N is an integer greater than 3.

Figure 8:
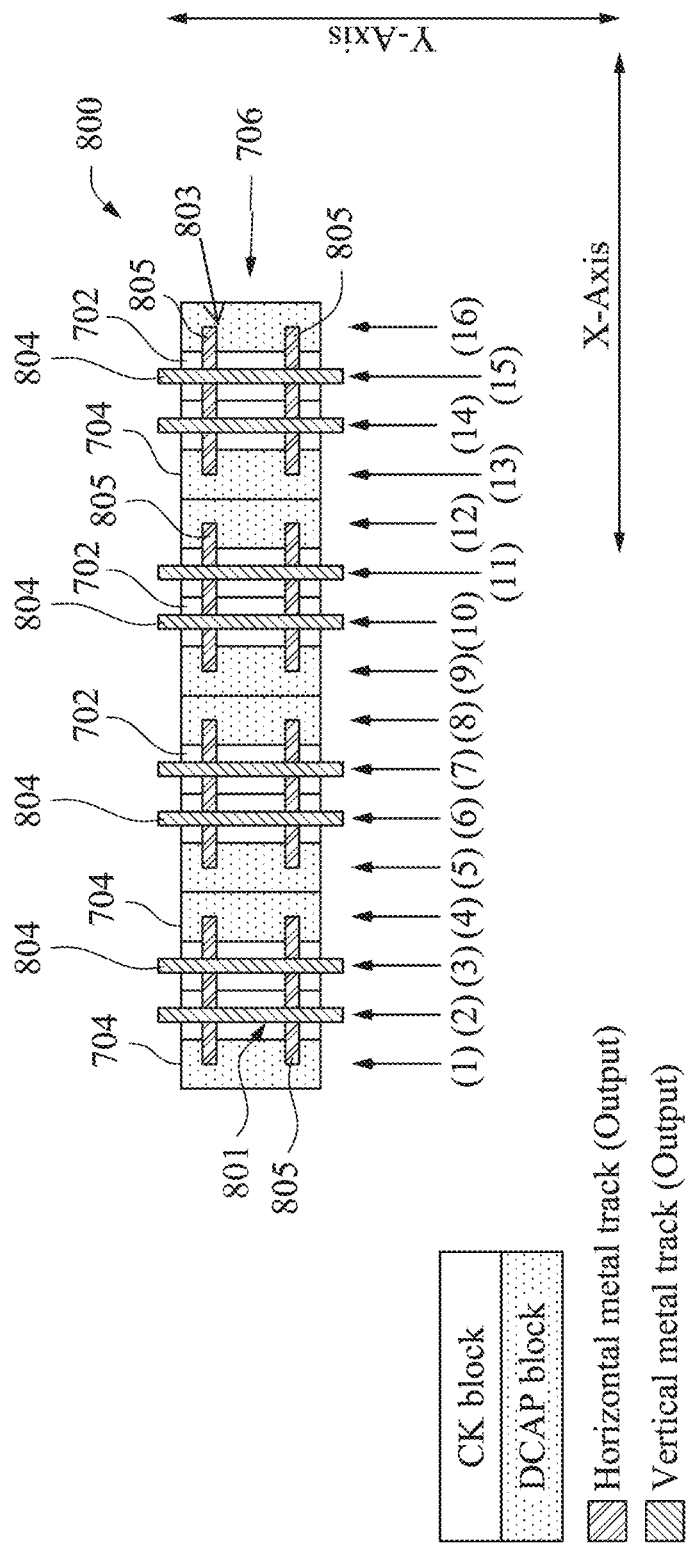
FIG. 8 is a block diagram of a cell region, in accordance with some embodiments.

FIG. 8 is a block diagram of a cell region 800, in accordance with some embodiments.

Cell region 800 is an example of a corresponding one of cell regions 102 in FIG. 1. Furthermore, cell region 800 includes the same arrangement of clock gate blocks 702 and decap blocks 704 described above with respect to FIG. 7. Thus, cell region 800 also includes row 706 of blocks, as described above with respect to FIG. 7.

In this embodiment, cell region 800 includes a metal layer 801. Examples of metal layer 801 include metal layer M0, metal layer M1, metal layer M2, and/or the like. Cell region 800 also includes a metal layer 803. Examples of metal layer 803 include metal layer M0, metal layer M1, metal layer M2, and/or the like. However, metal layer 801 and metal layer 803 are different metal layers. Metal layer 801 includes conductors 804 (not all of which are labelled for the sake of simplicity of illustration in FIG. 8). Each of conductors 804 has a long axis that extends parallel to the Y-axis. Each of conductors 804 extends over a corresponding one of clock gate blocks 702 but none of conductors 804 extends over each one of decap blocks 704.

With regard to metal layer 803, metal layer 803 includes conductors 805 (not all labeled for the sake of simplicity of illustration in FIG. 8). Each of conductors 805 has a long axis that extends parallel to the X-axis.

Each of conductors 805 extends over a corresponding group of adjacent clock gate blocks 702 but do not extend or only extend partially over decap blocks 704. In FIG. 8, two of conductors 805 extend over each corresponding group of adjacent clock gate blocks 702. Furthermore, each two of conductors 805 over a corresponding group of adjacent clock gate blocks 702 is unconnected to other conductors 805 over other corresponding groups of adjacent clock gate blocks 702.

In some embodiments, conductors 805 are connected to conductors 804 that extend over the same group of adjacent clock gate blocks 702. In some embodiments, one or more conductive vias connect conductors 805 and conductors 804 that extend over the same corresponding group of adjacent clock gate blocks 702. In some embodiments, one or more conductive vias and one or more other conductors in different metal layers other than metal layer 801, 803 connect conductors 805 and conductors 804 that extend over the same corresponding group of adjacent clock gate blocks 702.

The configuration of conductors 804, 805 provides for shorter horizontal metal tracks (i.e., conductors 805) so that currents along vertical metal track (i.e., conductors 804) do not accumulate. Shorter metal tracks fortify cell region 800 against problems such as self-heating, electromigration, or the like.

Figure 9:
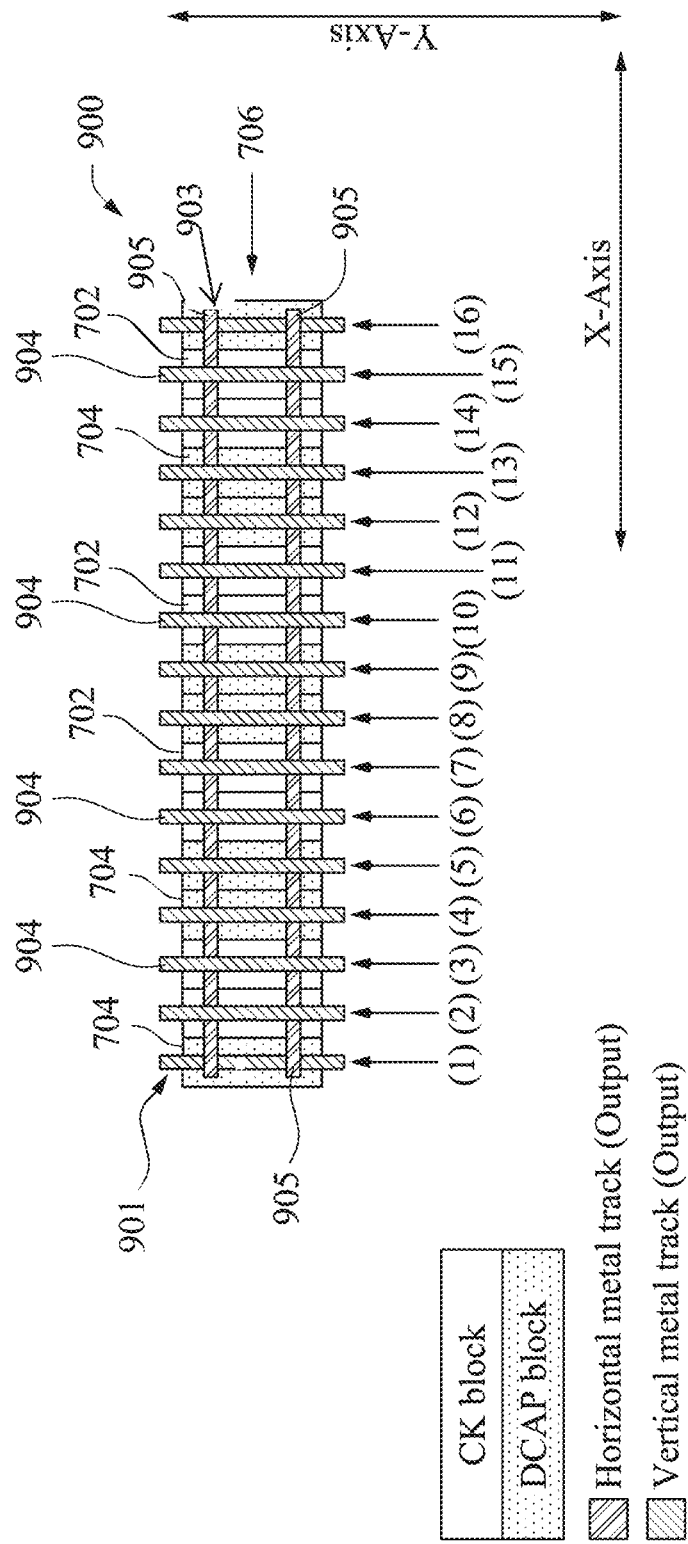
FIG. 9 is a block diagram of a cell region, in accordance with some embodiments.

FIG. 9 is a block diagram of a cell region 900, in accordance with some embodiments.

Cell region 900 is an example of a corresponding one of cell regions 102 in FIG. 1. Furthermore, cell region 900 includes the same arrangement of clock gate blocks 702 and decap blocks 704 described above with respect to FIG. 7. Thus, cell region 900 also includes row 706 of blocks, as described above with respect to FIG. 7.

In this embodiment, cell region 900 includes a metal layer 901. Examples of metal layer 901. include metal layer M0, metal layer M1, metal layer M2, and/or the like. Cell region 900 also includes a metal layer 903. Examples of metal layer 903 include metal layer M0, metal layer M1, metal layer M2, and/or the like. However, metal layer 901 and metal layer 903 are different metal layers. Metal layer 901 includes conductors 904 (not all of which are labelled for the sake of simplicity of illustration in FIG. 9). Each of conductors 904 has a long axis that extends parallel to the Y-axis. Each of conductors 904 extends over a corresponding block in row 706. More specifically, one corresponding conductor 904 extends over each of clock gate blocks 702 and one corresponding conductor 902 extends over each of decap blocks 704.

With regard to metal layer 903, metal layer 903 includes conductors 905. Each of conductors 905 has a long axis that extends parallel to the X-axis. In this case there are two conductors 905. Each of conductors 905 extends over all of the blocks in row 706.

In some embodiments, conductors 905 are connected to conductors 904 that extend over the same group of adjacent clock gate blocks 702. In some embodiments, one or more conductive vias connect conductors 905 and conductors 904 that extend over the same corresponding group of adjacent clock gate blocks 702. In some embodiments, one or more conductive vias and one or more other conductors in different metal layers other than metal layer 901, 903 connect conductors 905 and conductors 904 that extend over the same corresponding group of adjacent clock gate blocks 702.

This embodiment uses more vertical metal track (i.e., metal conductors 904) than the embodiment shown in FIG. 8. This helps ensure that current of cell region 900 are not overly concentrated, which fortifies cell region 900 against problems such as self-heating, electromigration, or the like.

Figure 10:
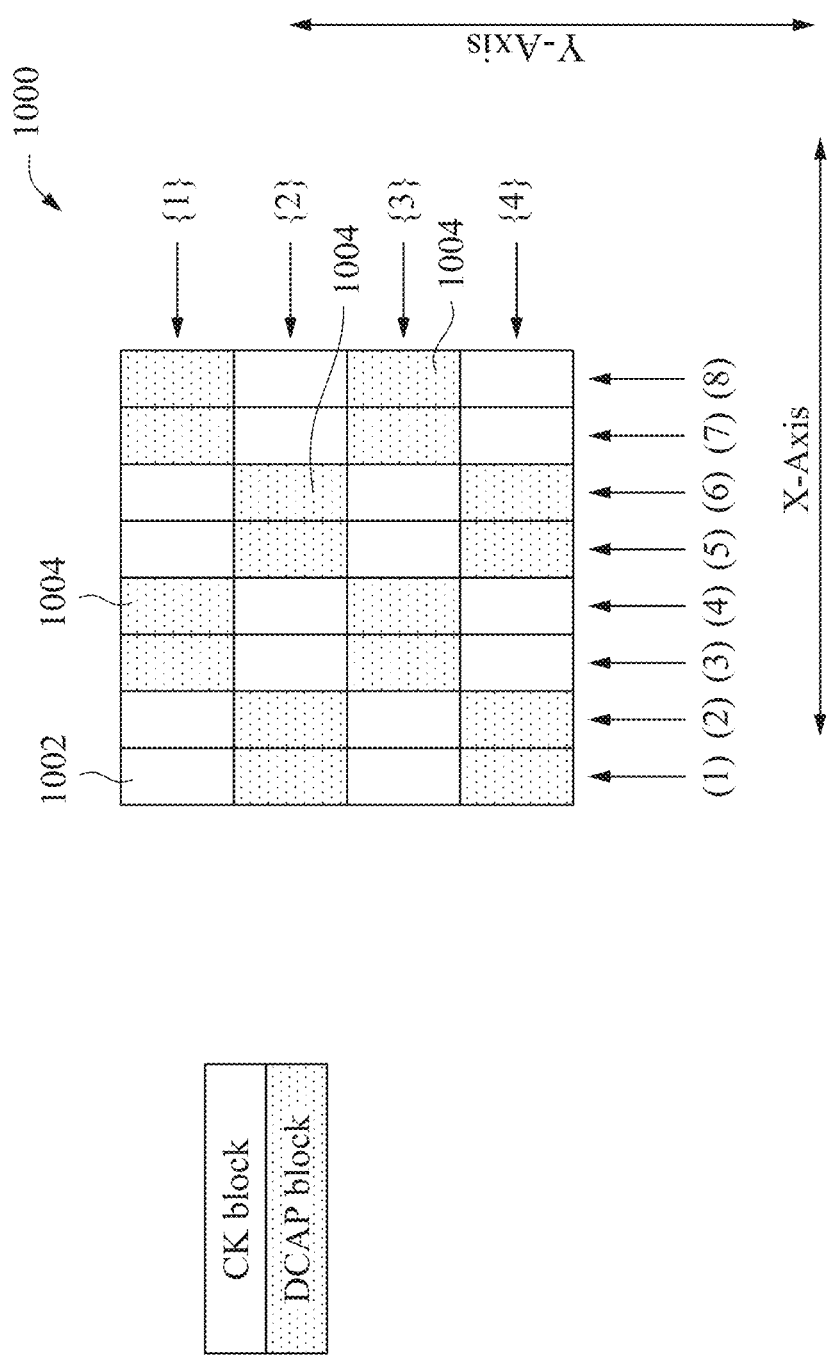
FIG. 10 is a block diagram of a cell region, in accordance with some embodiments.

FIG. 10 is a block diagram of a cell region 1000, in accordance with some embodiments.

Cell region 1000 is an example of a corresponding one of cell regions 102 in FIG. 1.

Each clock gate block is shown as a white block in FIG. 10 though not all of the white blocks are labeled 1002 for the sake of simplicity of illustration. Each decap block is shown as a shaded block in FIG. 10 though not all of the shaded blocks are labeled 1004 for the sake of simplicity of illustration. Clock gate blocks 1002 and decap blocks 1004 are interleaved in FIG. 10, and have a paired checkerboard pattern.

Rows are identified by an integer in brackets { } where the integer increases from top to bottom. Columns are identified by an integer in parentheses ( ) that increases from left to right. If N is an integer that identifies a total number of rows and M is an integer that identifies a total number of columns, then either N is greater than 5 or M has to be greater than 2 while the other integer has to be greater than or equal to 1. For example, N equals 6 and M equals 1, in some embodiments. Furthermore, N equals 1 and M equals 3, in some embodiments. The reason that either N is greater than 5 or M has to be greater than 2 is because at least 6 consecutive blocks are needed in a row and 3 consecutive block are needed in a column to get interleaving of clock gate blocks 1002 and decap blocks 1004. In FIG. 10, N is equal to 10 and M is equal to 8.

In FIG. 10, each of the rows includes blocks that alternate between groups of two adjacent clock gate blocks 1002 and groups of two adjacent decap blocks 1004. With respect to row {1}, groups of two are started with two adjacent clock gate block 1002 and ends with two adjacent decap blocks 1004. Starting with position (1) and position (2), each group of two adjacent clock gate blocks 1002 is separated by two block positions. Thus, blocks at position (1), position (2), position (5), position (6) are each clock gate blocks 1002. Starting with position (3) and position (4), each group of two adjacent decap blocks 1004 is separated by two block positions. Thus, blocks at position (3), position (4), position (7), and position (8) are each decap blocks. For the sake of convenience, the arrangement in row {1} is referred to as an odd-even group of 2 row.

With respect to row {2}, groups of two are started with two adjacent decap blocks 1004 and ends with two adjacent clock gate blocks 1002. Starting with position (1) and position (2), each group of two adjacent decap blocks 1004 is separated by two block positions. Thus, blocks at position (1), position (2), position (5), and position (6) are each decap blocks 1004. Starting with position (3) and position (4), each group of two adjacent clock gate blocks 1002 is separated by two block positions. Thus, blocks at position (3), position (4), position (7), position (8) are each clock gate blocks 1002. For the sake of convenience, the arrangement of row {2} is referred to as an even-odd group of 2 row.

In FIG. 10, each of the rows with an odd row position is odd-even group of 2 row and each of the rows with an even row position is an even-odd group of 2 row. Accordingly, in this embodiment, row {1} and row {3} are each odd-even group of 2 rows and row {2} and row {4} are each even-odd group of 2 rows.

In FIG. 10, starting with position (1) and position (2), each group of two adjacent clock gate blocks 1002 is separated by two block positions. Thus, blocks at position (1), position (2), position (5), position (6), would each be clock gate blocks 1002. Starting with position (3) and position (4), each group of two decap blocks 1004 is separated by two block positions. Thus, blocks at position (3), position (4), position (7), position (8), are each decap blocks 1004. For the sake of convenience, this alternative embodiment is referred to as an odd-even group of 2 row.

In FIG. 10, except for clock gate blocks 1002 at positions (1) and (8), each group of two adjacent clock gate blocks 1002 is between two groups of two adjacent decap blocks 1004. Additionally, except for two adjacent decap blocks 1004 at positions (1) and (8), each group of two adjacent decap block 1004 is between two groups of two adjacent clock gate blocks 1002.

In FIG. 10, each block in column (1) that is in an odd-numbered row position is one of clock gate blocks 1002 and each block in column (1) in an even-numbered row position is one of decap blocks 1004. More specifically, block {1}(1), block {3}(1) are each a corresponding clock gate block 1002 and block {2}(1), block {4}(1), are each a corresponding decap block 1004. The arrangement of column (1) is referred to as an odd-even column.

In FIG. 10, each block in column (3) that is in an even-numbered row position is one of clock gate blocks 1002 and each block in column (3) in an odd-numbered row position is one of decap blocks 1004. More specifically, block {1}(2), block {3}(2) are each a corresponding decap block 1004 and block {2}(2), block {4}(2), are each a corresponding clock gate block 1002. The arrangement of column (2) is referred to as an even-odd column.

In FIG. 10, columns (1), (2), (5), (6) are each odd-even columns and columns (3), (4), (7), (8) are each even-odd columns. In FIG. 10, cell region 1000 has row {1} and row {3} as odd-even group of 2 rows, row {2} and row {4} as even-odd group of 2 rows, columns (1), (2), (5), (6) as odd-even columns, and columns (3), (4), (7), (8) as even-odd columns. This type of arrangement is referred to as a type A cell region 1000.

In an alternative embodiment, cell region 1000 has row {1} and row {3} as even-odd group of 2 rows, row {2} and row {4} as odd-even group of 2 rows, columns (1), (2), (5), (6) as even-odd columns, and columns (3), (4), (7), (8) as odd-even columns. This type of arrangement is referred to as a type B cell region 1000. Both type A cell region 1000 and type B cell region 1000 have interleaving of clock gate blocks 1002 and decap blocks 1004 with respect to both the X-axis and the Y-axis.

Figure 11:
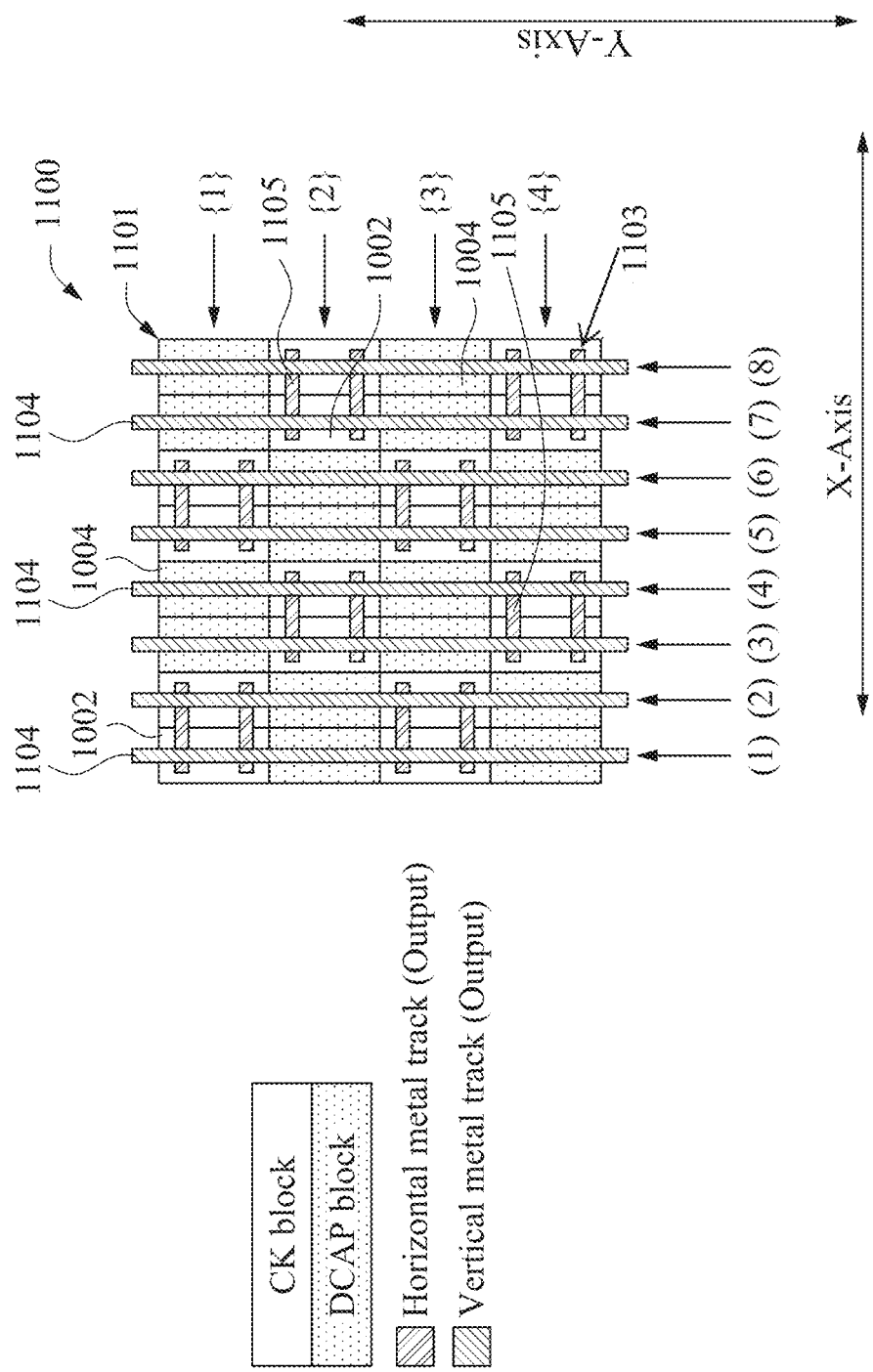
FIG. 11 is a block diagram of a cell region, in accordance with some embodiments.

FIG. 11 is a block diagram of a cell region 1100, in accordance with some embodiments.

Each clock gate block is shown as a white block in FIG. 11 though not all of the white blocks are labeled 1002 for the sake of simplicity of illustration. Each decap block is shown as a shaded block in FIG. 11 though not all of the shaded blocks are labeled 1004 for the sake of simplicity of illustration. Thus, cell region 1100 also includes rows and columns of blocks, as described above with respect to FIG. 10.

In this embodiment, cell region 1100 includes a metal layer 1101. Examples of metal layer 1101 include metal layer M0, metal layer M1, metal layer M2, and/or the like. Cell region 1100 also includes a metal layer 1103. Examples of metal layer 1103 include metal layer M0, metal layer M1, metal layer M2, and/or the like. However, metal layer 1101 and metal layer 1103 are different metal layers. Metal layer 1101 includes conductors 1104 (not all of which are labelled for the sake of simplicity of illustration in FIG. 11). Each of conductors 1104 has a long axis that extends parallel to the Y-axis. Each of conductors 1104 extends over a corresponding one of columns (1)-(8). Thus, for each of columns (1)-(8), one of conductors 1104 extends over all of the blocks in the column.

With regard to metal layer 1103, metal layer 1103 includes conductors 1105 (not all labeled for the sake of simplicity of illustration in FIG. 11). Each of conductors 1105 has a long axis that extends parallel to the X-axis.

Each of conductors 1105 extends over a corresponding group of adjacent clock gate blocks 1002 but do not extend or only extend partially over decap blocks 1004. In FIG. 11, two of conductors 1105 extend over each corresponding group of adjacent clock gate blocks 1002. Furthermore, each two of conductors 1105 over a corresponding group of adjacent clock gate blocks 1002 is unconnected to other conductors 1105 over other corresponding groups of adjacent clock gate blocks 1002.

In some embodiments, conductors 1105 are connected to conductors 1104 that extend over the same group of adjacent clock gate blocks 1002. In some embodiments, one or more conductive vias connect conductors 1105 and conductors 1104 that extend over the same corresponding group of adjacent clock gate blocks 1002. In some embodiments, one or more conductive vias and one or more other conductors in different metal layers other than metal layer 1101, 1103 connect conductors 1105 and conductors 1104 that extend over the same corresponding group of adjacent clock gate blocks 1002.

The configuration of conductors 1104, 1105 provides for shorter horizontal metal tracks (i.e., conductors 1105) so that currents along vertical metal track (i.e., conductors 1104 do not accumulate.

Figure 12:
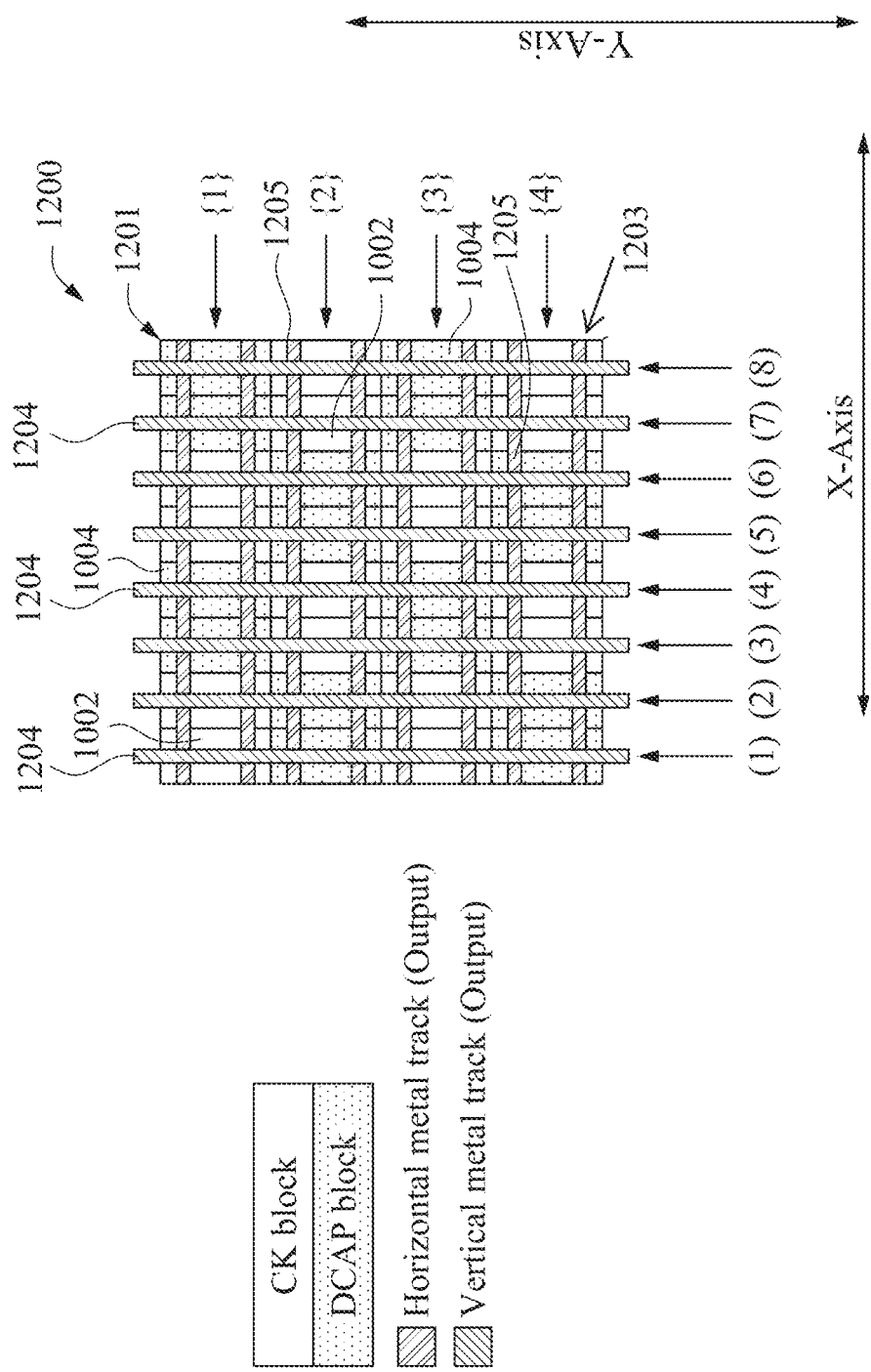
FIG. 12 is a block diagram of a cell region, in accordance of some embodiments.

FIG. 12 is a block diagram of a cell region 1200, in accordance with some embodiments.

Each clock gate block is shown as a white block in FIG. 12 though not all of the white blocks are labeled 1002 for the sake of simplicity of illustration. Each decap block is shown as a shaded block in FIG. 12 though not all of the shaded blocks are labeled 1004 for the sake of simplicity of illustration. Thus, cell region 1200 also includes rows and columns of blocks, as described above with respect to FIG. 10.

In this embodiment, cell region 1200 includes a metal layer 1202. Examples of metal layer 1202 include metal layer M0, metal layer M1, metal layer M2, and/or the like. Cell region 1200 also includes a metal layer 1203. Examples of metal layer 1203 include metal layer M0, metal layer M1, metal layer M2, and/or the like. However, metal layer 1202 and metal layer 1203 are different metal layers. Metal layer 1202 includes conductors 1204 (not all of which are labelled for the sake of simplicity of illustration in FIG. 12). Each of conductors 1204 has a long axis that extends parallel to the Y-axis. Each of conductors 1204 extends over a corresponding one of columns (1)-(8). Thus, for each of columns (1)-(8), one of conductors 1204 extends over all of the blocks in the column.

With regard to metal layer 1203, metal layer 1203 includes conductors 1205 (not all labeled for the sake of simplicity of illustration in FIG. 12). Each of conductors 1205 has a long axis that extends parallel to the X-axis.

Each of conductors 1205 extends over all of the blocks in a corresponding row. In FIG. 12, two of conductors 1205 extend over each corresponding row.

In some embodiments, conductors 1205 are connected to conductors 1204 that extend over the same group of adjacent clock gate blocks 1002. In some embodiments, one or more conductive vias connect conductors 1205 and conductors 1204 that extend over the same corresponding group of adjacent clock gate blocks 1002. In some embodiments, one or more conductive vias and one or more other conductors in different metal layers other than metal layer 1202, 1203 connect conductors 1205 and conductors 1204 that extend over the same corresponding group of adjacent clock gate blocks 1002.

In FIG. 12, vertical metal tracks (i.e., metal conductors 1204) help ensure that current are not overly concentrated.

Figure 13:
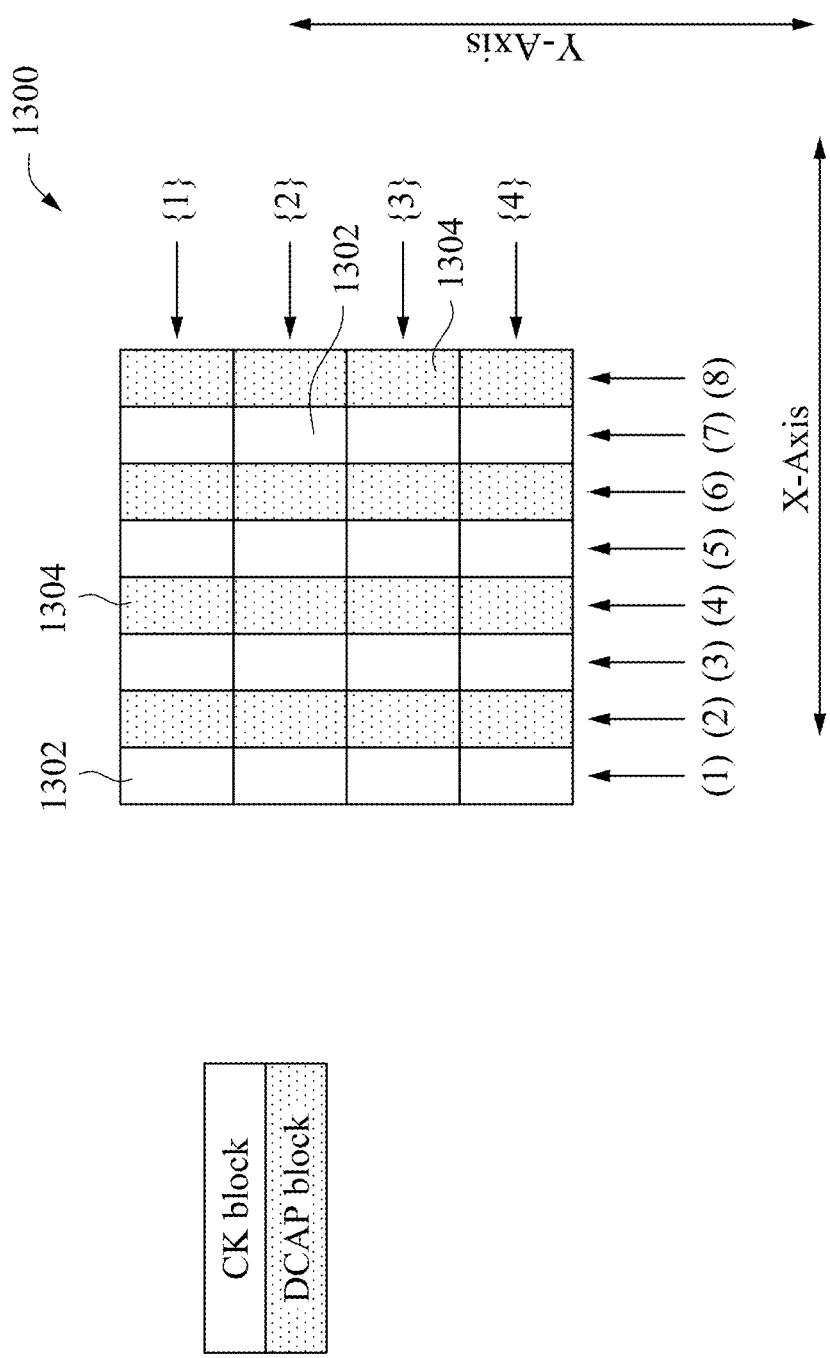
FIG. 13 is a block diagram of a cell region, in accordance with some embodiments.

FIG. 13 is a block diagram of a cell region 1300, in accordance with some embodiments.

Cell region 1300 is an example of a corresponding one of cell regions 102 in FIG. 1.

Each clock gate block is shown as a white block in FIG. 13 though not all of the white blocks are labeled 1302 for the sake of simplicity of illustration. Each decap block is shown as a shaded block in FIG. 13 though not all of the shaded blocks are labeled 1304 for the sake of simplicity of illustration. Clock gate blocks 1302 and decap blocks 1304 are interleaved in FIG. 13, and have a vertically-striped pattern.

Rows are identified by an integer in brackets { } where the integer increases from top to bottom. Columns are identified by an integer in parentheses ( ) that increases from left to right. If N is an integer that identifies a total number of rows and M is an integer that identifies a total number of columns, then N is greater than 2 and M has to be greater than 1. For example, N equals 3 and M equals 1, in some embodiments. The reason that either N is greater than 2 is because at least 3 consecutive blocks are needed to provide interleaving between clock gate blocks 1302 and decap blocks 1304 with respect to the X-axis. In FIG. 13, N is equal to 10 and M is equal to 8. As explained below, there is no interleaving of clock gate blocks 1302 and decap blocks 1304 with respect to the Y-axis. Thus, the size of the columns or M has no effect on interleaving between clock gate blocks 1302 and decap blocks 1304.

In FIG. 13, row {1}-{4} are all odd-even rows. Accordingly, cell region 1300 has interleaving with respect to the X-axis. All of the blocks in column (1) are all clock gate blocks 1302. This type of column is referred to as an all clock gate column. All of the blocks in column (2) are all decap blocks 1304. This type of column is referred to as an all decap column. In FIG. 13, each column (1), (3), (5), (7) in an odd column position is an all clock gate column and each column (2), (4), (6), (8) in an even column position is an all decap column. Because columns (1)-(8) do not alternate in any manner between clock gate blocks 1302 and decap blocks 1304, clock gate blocks 1302 and decap blocks 1304 are not interleaved with respect to the Y-axis. Cell region 1300 shown in FIG. 13 is referred to as a Type A cell region 1300.

In an alternative embodiment, row {1}-{4} are all even-odd rows. In this alternative embodiment, each column (1), (3), (5), (7) in an odd column position is an all decap column and each column (2), (4), (6), (8) is an all clock gate column. This alternative embodiment is referred to as a Type B cell region 1300.

Figure 14:
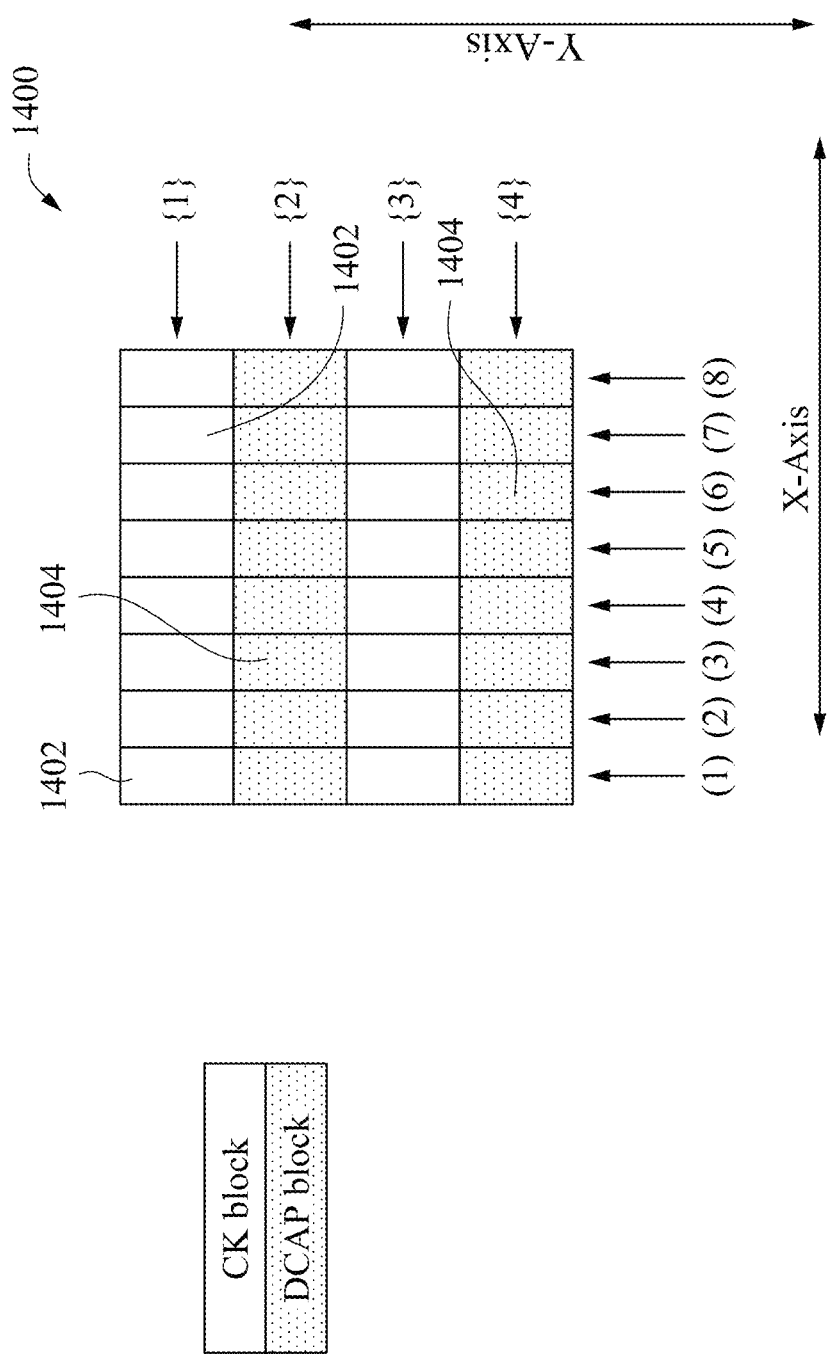
FIG. 14 is a block diagram of a cell region, in accordance with some embodiments.

FIG. 14 is a block diagram of a cell region 1400, in accordance with some embodiments.

Cell region 1400 is an example of a corresponding one of cell regions 102 in FIG. 1.

Each clock gate block is shown as a white block in FIG. 14 though not all of the white blocks are labeled 1402 for the sake of simplicity of illustration. Each decap block is shown as a shaded block in FIG. 14 though not all of the shaded blocks are labeled 1404 for the sake of simplicity of illustration. Clock gate blocks 1402 and decap blocks 1404 are interleaved in FIG. 14, and have a horizontally-striped pattern.

Rows are identified by an integer in brackets { } where the integer increases from top to bottom. Columns are identified by an integer in parentheses ( ) that increases from left to right. If N is an integer that identifies a total number of rows and M is an integer that identifies a total number of columns, then M is greater than 2 and N has to be greater than 1. For example, M equals 3 and N equals 1, in some embodiments. The reason that either M is greater than 2 is because at least 3 consecutive blocks are needed to provide interleaving between clock gate blocks 1402 and decap blocks 1404 with respect to the Y-axis. As explained below, there is no interleaving of clock gate blocks 1402 and decap blocks 1404 with respect to the X-axis. Thus, the number of columns N has no effect on interleaving between clock gate blocks 1402 and decap blocks 1404. In FIG. 14, M is equal to 4 and N is equal to 8.

In FIG. 14, all of the blocks in row {1} are all clock gate blocks 1402. This type of row is referred to as an all clock gate row. All of the blocks in row {2} are all decap blocks 1404. This type of row is referred to as an all decap row. In FIG. 14, each row {1}, {3} in an odd row position is an all clock gate row and each row {2}, {4} in an even row position is an all decap row. Because row {1}-{4} do not alternate in any manner between clock gate blocks 1402 and decap blocks 1404, clock gate blocks 1402 and decap blocks 1404 are not interleaved with respect to the X-axis. In FIG. 14, columns (1)-(8) are all odd-even columns. Accordingly, cell region 1400 has interleaving with respect to the Y-axis. Cell region 1400 shown in FIG. 14 is referred to as a Type A cell region 1400.

In an alternative embodiment, columns (1)-(8) are all even-odd columns. In this alternative embodiment, each row {1}, {3} in an odd row position is an all decap row and each row {2}, {4} is an all clock gate row. This alternative embodiment is referred to as a Type B cell region 1400.

Figure 15:
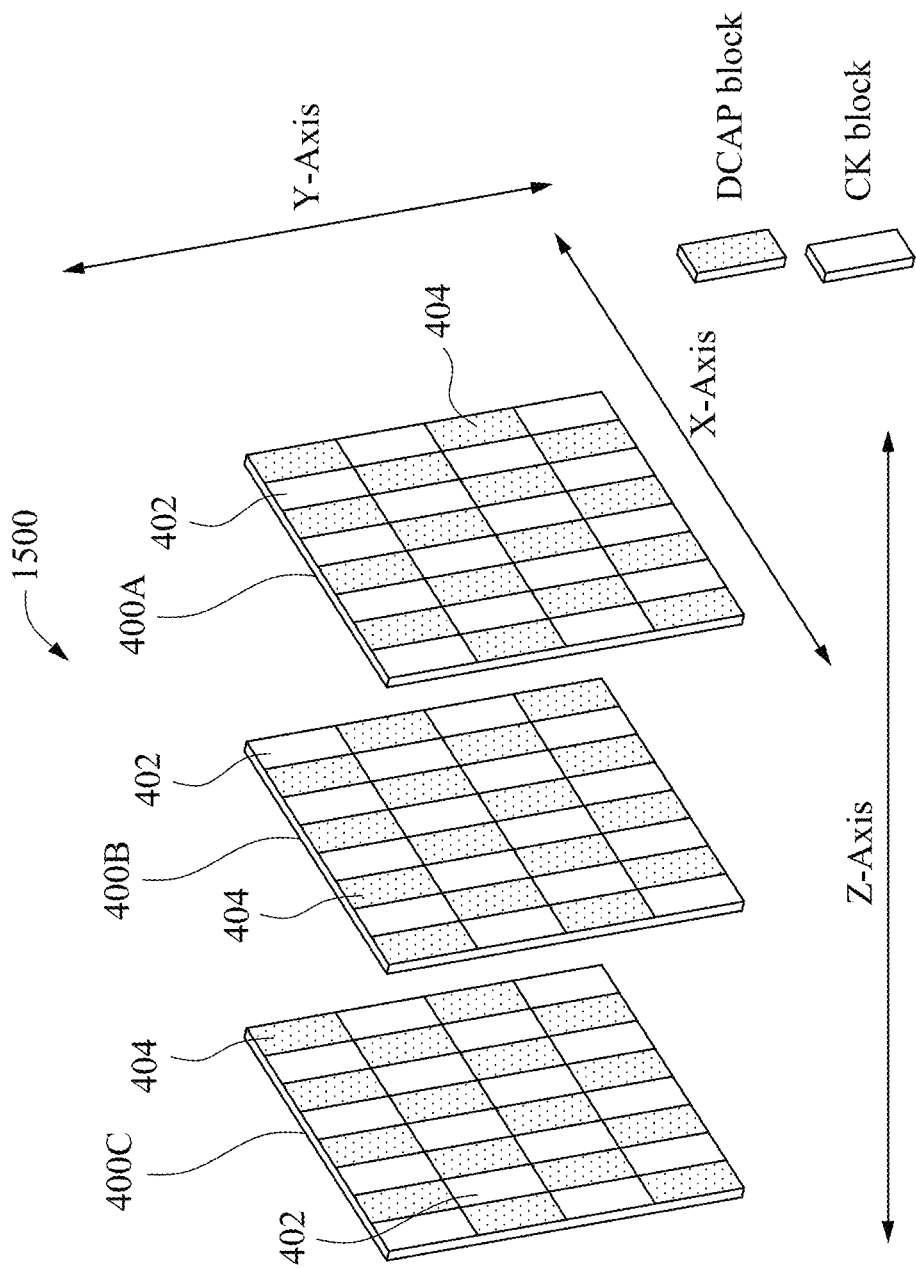
FIG. 15 is a block diagram of a cell region, in accordance with some embodiments.

FIG. 15 is a block diagram of a cell region 1500, in accordance with some embodiments.

Cell region 1500 is an example of a corresponding one of cell regions 102 in FIG. 1.

Cell region 1500 includes a set of clock gate blocks 402 (identified as white blocks in FIG. 15 and not all labeled 402 for the sake of simplicity of illustration in FIG. 15) and a set of decap blocks 404 (identified as shaded blocks in FIG. 15 and not all labeled 404 for the sake of simplicity of illustration in FIG. 15). Clock gate blocks 402 and decap blocks 404 are interleaved in FIG. 15.

Cell region 1500 includes a substrate layer 400A that includes a set of clock gate blocks 402 and a set of decap blocks 404. Clock gate blocks 402 and decap blocks 404 are arranged in rows and columns with respect to the X-axis and with respect to the Y-axis. In this example, clock gate blocks 402 and decap blocks 404 in the rows and columns of substrate layer 400A are organized as a type A cell region 400 as described above.

Cell region 1500 further includes a substrate layer 400B beneath substrate layer 400A with respect to a third direction that is perpendicular to both the X-axis and the Y-axis and thus is parallel with the Z-axis. Cell region 1500 includes a set of clock gate blocks 402 and a set of decap blocks 404. Clock gate blocks 402 and decap blocks 404 are arranged in rows and columns with respect to the X-axis and with respect to the Y-axis. In this example, clock gate blocks 402 and decap blocks 404 in the rows and columns of substrate layer 400B are organized as a type B cell region 400 as described above.

Cell region 1500 includes a substrate layer 400C beneath substrate layer 400B with respect the Z-axis. Cell region 1500 includes a set of clock gate blocks 402 and a set of decap blocks 404. Clock gate blocks 402 and decap blocks 404 are arranged in rows and columns with respect to the X-axis and with respect to the Y-axis. In this example, clock gate blocks 402 and decap blocks 404 in the rows and columns of substrate layer 400C are organized as a type A cell region 400 as described above.

In some embodiments, substrate layers 400A, 400B, 400C are interconnected to each other. In some embodiments, blocks in substrate layers 400A, 400B, 400C are interconnected through through-substrate vias (TSVs). Because substrate layer 400A is arranged as a type A cell region 400, substrate layer 400B is arranged as a type B cell region 400, and substrate layer 400C is arranged as a type A cell region 400, cell region 1500 interleaves clock gate blocks 402 and decap blocks 404 with respect to the Z-axis.

Figure 16:
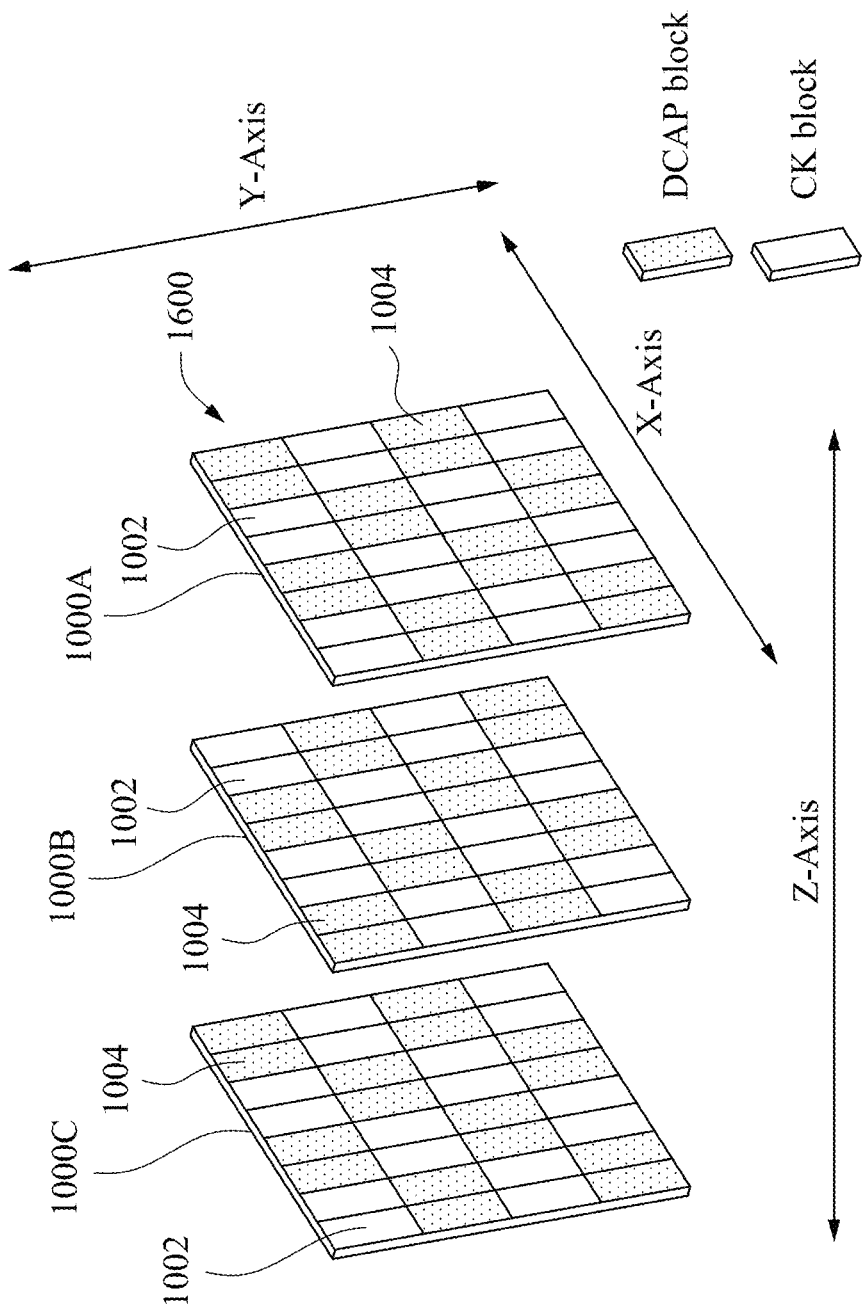
FIG. 16 is a block diagram of a cell region, in accordance with some embodiments.

FIG. 16 is a block diagram of a cell region 1600, in accordance with some embodiments.

Cell region 1600 is an example of a corresponding one of cell regions 102 in FIG. 1.

Cell region 1600 includes a set of clock gate blocks 1002 (identified as white blocks in FIG. 16 and not all labeled 1002 for the sake of simplicity of illustration in FIG. 16) and a set of decap blocks 1004 (identified as shaded blocks in FIG. 16 and not all labeled 1004 for the sake of simplicity of illustration in FIG. 16). Clock gate blocks 1002 and decap blocks 1004 are interleaved in FIG. 16.

Cell region 1600 includes a substrate layer 1000A that includes a set of clock gate blocks 1002 and a set of decap blocks 1004. Clock gate blocks 1002 and decap blocks 1004 are arranged in rows and columns with respect to the X-axis and with respect to the Y-axis. In this example, clock gate blocks 1002 and decap blocks 1004 in the rows and columns of substrate layer 1000A are organized as a type A cell region 1000 as described above.

Cell region 1600 includes a substrate layer 1000B beneath substrate layer 1000A with respect to a third direction that is perpendicular to both the X-axis and the Y-axis and thus is parallel with the Z-axis. Cell region 1600 includes a set of clock gate blocks 1002 and a set of decap blocks 1004. Clock gate blocks 1002 and decap blocks 1004 are arranged in rows and columns with respect to the X-axis and with respect to the Y-axis. In this example, clock gate blocks 1002 and decap blocks 1004 in the rows and columns of substrate layer 1000B are organized as a type B cell region 1000 as described above.

Cell region 1600 includes a substrate layer 1000C beneath substrate layer 1000B with respect the Z-axis. Cell region 1600 includes a set of clock gate blocks 1002 and a set of decap blocks 1004. Clock gate blocks 1002 and decap blocks 1004 are arranged in rows and columns with respect to the X-axis and with respect to the Y-axis. In this example, clock gate blocks 1002 and decap blocks 1004 in the rows and columns of substrate layer 1000C are organized as a type A cell region 1000 as described above.

In some embodiments, substrate layers 1000A, 1000B, 1000C are interconnected to each other. In some embodiments, blocks in substrate layers 1000A, 1000B, 1000C are interconnected through TSVs. Because substrate layer 1000A is arranged as a type A cell region 1000, substrate layer 1000B is arranged as a type B cell region 1000, and substrate layer 1000C is arranged as a type A cell region 1000, cell region 1600 interleaves clock gate blocks 1002 and decap blocks 1004 with respect to the Z-axis.

Figure 17:
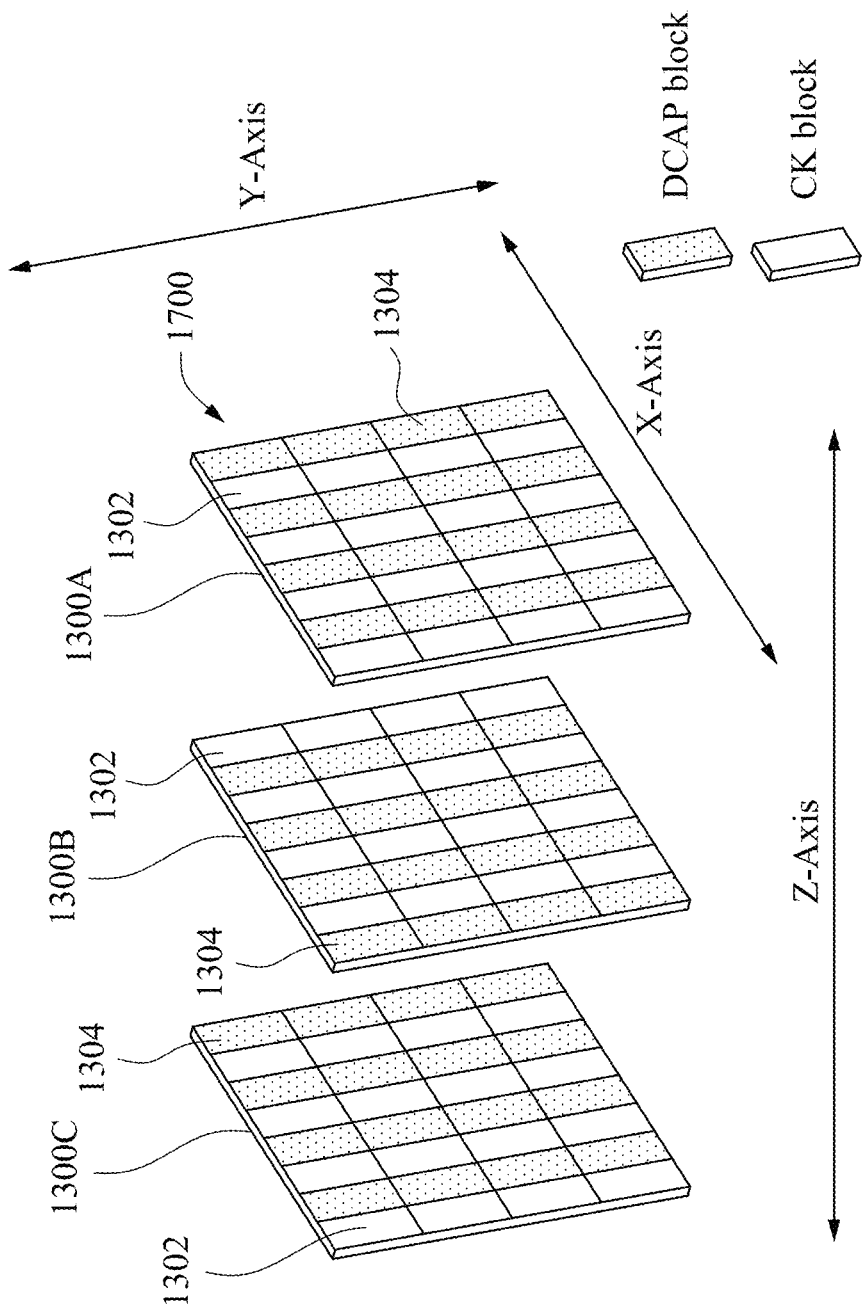
FIG. 17 is a block diagram of a cell region, in accordance with some embodiments.

FIG. 17 is a block diagram of a cell region 1700, in accordance with some embodiments.

Cell region 1700 is an example of a corresponding one of cell regions 102 in FIG. 1.

Cell region 1700 includes a set of clock gate blocks 1302 (identified as white blocks in FIG. 17 and not all labeled 1302 for the sake of simplicity of illustration in FIG. 17) and a set of decap blocks 1304 (identified as shaded blocks in FIG. 17 and not all labeled 1304 for the sake of simplicity of illustration in FIG. 17). Clock gate blocks 1302 and decap blocks 1304 are interleaved in FIG. 17.

Cell region 1700 includes a substrate layer 1300A that includes a set of clock gate blocks 1302 and a set of decap blocks 1304. Clock gate blocks 1302 and decap blocks 1304 are arranged in rows and columns with respect to the X-axis and with respect to the Y-axis. In this example, clock gate blocks 1302 and decap blocks 1304 in the rows and columns of substrate layer 1300A are organized as a type A cell region 1300 as described above.

Cell region 1700 includes a substrate layer 1300B beneath substrate layer 1300A with respect to a third direction that is perpendicular to both the X-axis and the Y-axis and thus is parallel with the Z-axis. Cell region 1700 includes a set of clock gate blocks 1302 and a set of decap blocks 1304. Clock gate blocks 1302 and decap blocks 1304 are arranged in rows and columns with respect to the X-axis and with respect to the Y-axis. In this example, clock gate blocks 1302 and decap blocks 1304 in the rows and columns of substrate layer 1300B are organized as a type B cell region 1300 as described above.

Cell region 1700 includes a substrate layer 1300C beneath substrate layer 1300B with respect the Z-axis. Cell region 1700 includes a set of clock gate blocks 1302 and a set of decap blocks 1304. Clock gate blocks 1302 and decap blocks 1304 are arranged in rows and columns with respect to the X-axis and with respect to the Y-axis. In this example, clock gate blocks 1302 and decap blocks 1304 in the rows and columns of substrate layer 1300C are organized as a type A cell region 1300 as described above.

In some embodiments, substrate layers 1300A, 1300B, 1300C are interconnected to each other. In some embodiments, blocks in substrate layers 1300A, 1300B, 1300C are interconnected through TSVs. Because substrate layer 1300A is arranged as a type A cell region 1300, substrate layer 1300B is arranged as a type B cell region 1300, and substrate layer 1300C is arranged as a type A cell region 1300, cell region 1700 interleaves clock gate blocks 1302 and decap blocks 1304 with respect to the Z-axis.

Figure 18:
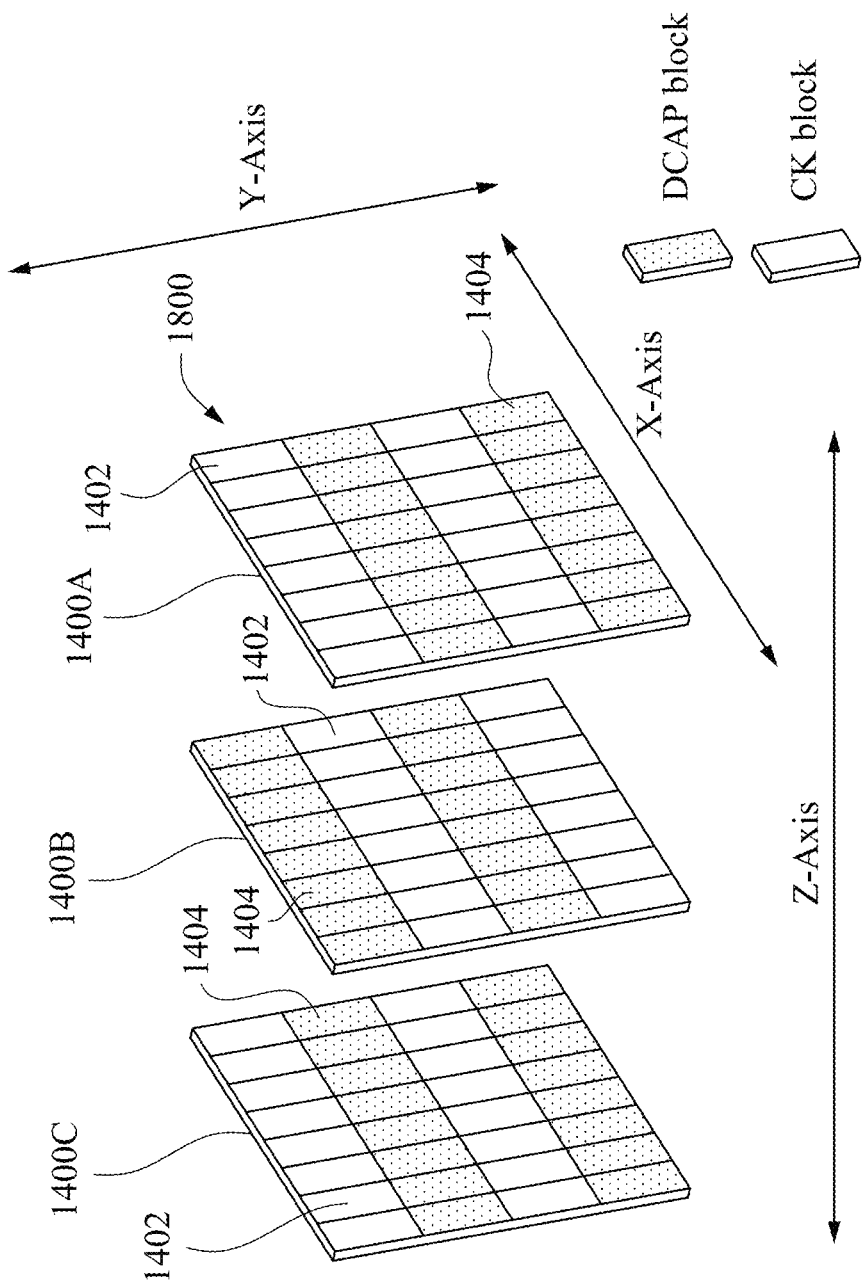
FIG. 18 is a block diagram of a cell region, in accordance with some embodiments.

FIG. 18 is a block diagram of a cell region 1800, in accordance with some embodiments.

Cell region 1800 is an example of a corresponding one of cell regions 102 in FIG. 1.

Cell region 1800 includes a set of clock gate blocks 1402 (identified as white blocks in FIG. 18 and not all labeled 1402 for the sake of simplicity of illustration in FIG. 18) and a set of decap blocks 1404 (identified as shaded blocks in FIG. 18 and not all labeled 1404 for the sake of simplicity of illustration in FIG. 18). Clock gate blocks 1402 and decap blocks 1404 are interleaved in FIG. 18.

Cell region 1800 includes a substrate layer 1400A that includes a set of clock gate blocks 1402 and a set of decap blocks 1404. Clock gate blocks 1402 and decap blocks 1404 are arranged in rows and columns with respect to the X-axis and with respect to the Y-axis. In this example, clock gate blocks 1402 and decap blocks 1404 in the rows and columns of substrate layer 1400A are organized as a type A cell region 1400 as described above.

Cell region 1800 includes a substrate layer 1400B beneath substrate layer 1400A with respect to a third direction that is perpendicular to both the X-axis and the Y-axis and thus is parallel with the Z-axis. Cell region 1800 includes a set of clock gate blocks 1402 and a set of decap blocks 1404. Clock gate blocks 1402 and decap blocks 1404 are arranged in rows and columns with respect to the X-axis and with respect to the Y-axis. In this example, clock gate blocks 1402 and decap blocks 1404 in the rows and columns of substrate layer 1400B are organized as a type B cell region 1400 as described above.

Cell region 1800 includes a substrate layer 1400C beneath substrate layer 1400B with respect the Z-axis. Cell region 1800 includes a set of clock gate blocks 1402 and a set of decap blocks 1404. Clock gate blocks 1402 and decap blocks 1404 are arranged in rows and columns with respect to the X-axis and with respect to the Y-axis. In this example, clock gate blocks 1402 and decap blocks 1404 in the rows and columns of substrate layer 1400C are organized as a type A cell region 1400 as described above.

In some embodiments, substrate layers 1400A, 1400B, 1400C are interconnected to each other. In some embodiments, blocks in substrate layers 1400A, 1400B, 1400C are interconnected through TSVs. Because substrate layer 1400A is arranged as a type A cell region 1400, substrate layer 1400B is arranged as a type B cell region 1400, and substrate layer 1400C is arranged as a type A cell region 1400, cell region 1800 interleaves clock gate blocks 1402 and decap blocks 1404 with respect to the Z-axis.

Figure 19:
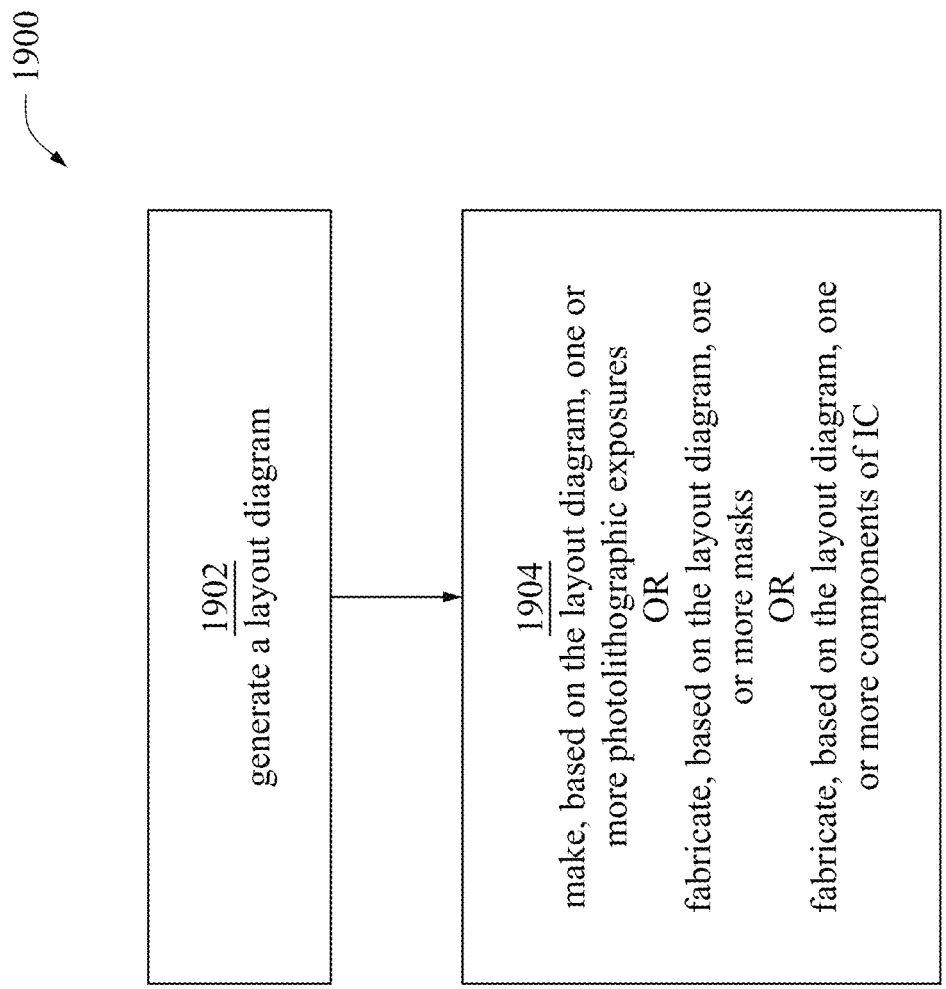
FIG. 19 is a flowchart of a method of manufacturing a semiconductor device, in accordance with some embodiments.

FIG. 19 is a flowchart of a method 1900 of manufacturing a semiconductor device, in accordance with some embodiments.

Method 1900 is implementable, for example, using EDA system 2200 (FIG. 22, discussed below) and an integrated circuit (IC) manufacturing system 2300 (FIG. 23, discussed below), in accordance with some embodiments.

In FIG. 19, method 1900 includes blocks 1902-1904. At block 1902, a layout diagram is generated. Example layout diagrams that are generated at block 1902 include a layout diagram that represents semiconductor device 100 in FIG. 1, cell region 200 in FIG. 2, cell region 300 in FIG. 3, cell region 400 in FIG. 4, cell region 500 in FIG. 5, cell region 600 in FIG. 6, cell region 700 in FIG. 7, cell region 800 in FIG. 8, cell region 900 in FIG. 9, cell region 1000 in FIG. 10, cell region 1100 in FIG. 11, cell region 1200 in FIG. 12, cell region 1300 in FIG. 13, cell region 1400 in FIG. 14, cell region 1500 in FIG. 15, cell region 1600 in FIG. 16, cell region 1700 in FIG. 17, and cell region 1800 in FIG. 18. In some embodiments, layout diagram in block 1902 is generated by EDA system 2200, discussed below in FIG. 22. From block 1902, flow proceeds to block 1904.

At block 1904, based on the layout diagram, at least one of (A) one or more photolithographic exposures are made or (B) one or more semiconductor masks are fabricated or (C) one or more components in a layer of a semiconductor device are fabricated. See discussion below of IC manufacturing system 2300 in FIG. 23 below.

FIG. 20 is a flowchart 2000 of a method of generating a layout diagram, in accordance with some embodiments.

Flowchart includes blocks 2002-2004. Flowchart 2000 is an exemplary embodiment of block 1902 in FIG. 19. Example layout diagrams which represent the structures produced according to flowchart 2000 include layout diagrams corresponding to semiconductor device 100 in FIG. 1, cell region 200 in FIG. 2, cell region 300 in FIG. 3, cell region 400 in FIG. 4, cell region 500 in FIG. 5, cell region 600 in FIG. 6, cell region 700 in FIG. 7, cell region 800 in FIG. 8, cell region 900 in FIG. 9, cell region 1000 in FIG. 10, cell region 1100 in FIG. 11, cell region 1200 in FIG. 12, cell region 1300 in FIG. 13, cell region 1400 in FIG. 14, cell region 1500 in FIG. 15, cell region 1600 in FIG. 16, cell region 1700 in FIG. 17, cell region 1800 in FIG. 18, or the like. In some embodiments, blocks in flowchart 2000 are implemented by EDA system 2200, discussed below in FIG. 22.

At block 2002, a first set of one or more first blocks are formed, each of the first blocks including a clock gate pattern. Examples of first blocks include patterns of clock gate blocks 202 in FIG. 2 and FIG. 3, clock gate blocks 402 in FIG. 4, FIG. 5, and FIG. 15, clock gate blocks 602 in FIG. 6, clock gate blocks 702 in FIG. 7, FIG. 8, and FIG. 9, clock gate blocks 1002 in FIG. 10, FIG. 11, FIG. 12, and FIG. 16, clock gate blocks 1302 in FIG. 13 and FIG. 17 and clock gate blocks 1402 in FIG. 14 and FIG. 18. From block 2002, flow proceeds to block 2004.

At block 2004, a second set of one or more second blocks are formed, each of the second blocks including a decap pattern wherein at least one of the first set has two or more first blocks or the second set has two or more second blocks, and the first blocks of the first set are interleaved with the second blocks of the second set. Examples of second blocks include patterns of decap blocks 204 in FIG. 2 and FIG. 3, decap blocks 404 in FIG. 4, FIG. 5, and FIG. 15, decap blocks 604 in FIG. 6, decap blocks 704 in FIG. 7, FIG. 8, and FIG. 9, decap blocks 1004 in FIG. 10, FIG. 11, FIG. 12, and FIG. 16, decap blocks 1304 in FIG. 13 and FIG. 17 and decap blocks 1404 in FIG. 14 and FIG. 18.

Figure 21:
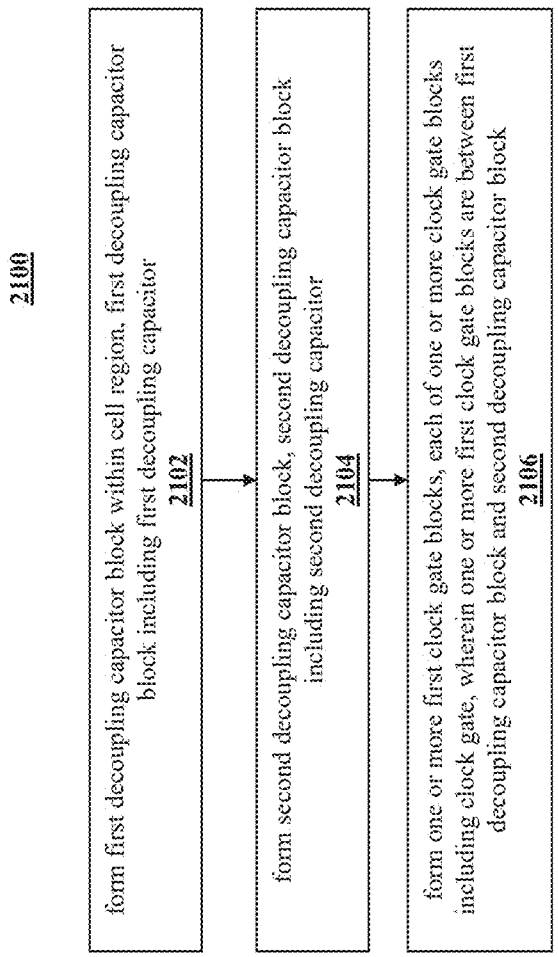
FIG. 21 is a flowchart of a method of fabricating a semiconductor device having a cell region, in accordance with some embodiments.

FIG. 21 is a flowchart 2100 of a method of fabricating a semiconductor device having a cell region, in accordance with some embodiments.

Flowchart includes blocks 2102-2104. Flowchart 2100 is an exemplary embodiment of block 1904 in FIG. 19. Example layout diagrams which represent the structures produced according to flowchart 2100 include layout diagrams corresponding to semiconductor device 100 in FIG. 1, cell region 200 in FIG. 2, cell region 300 in FIG. 3, cell region 400 in FIG. 4, cell region 500 in FIG. 5, cell region 600 in FIG. 6, cell region 700 in FIG. 7, cell region 800 in FIG. 8, cell region 900 in FIG. 9, cell region 1000 in FIG. 10, cell region 1100 in FIG. 11, cell region 1210 in FIG. 12, cell region 1300 in FIG. 13, cell region 1400 in FIG. 14, cell region 1500 in FIG. 15, cell region 1600 in FIG. 16, cell region 1700 in FIG. 17, cell region 1800 in FIG. 18, or the like. In some embodiments, blocks in flowchart 2100 are implemented by IC manufacturing system 2300 in FIG. 23 below.

At block 2102, a first decap block is formed within the cell region, the first decap block including a first decap. Examples of first decap block include decap blocks 204 in FIG. 2 and FIG. 3, decap blocks 404 in FIG. 4, FIG. 5, and FIG. 15, decap blocks 604 in FIG. 6, decap blocks 704 in FIG. 7, FIG. 8, and FIG. 9, decap blocks 1004 in FIG. 10, FIG. 11, FIG. 12, and FIG. 16, decap blocks 1304 in FIG. 13 and FIG. 17 and decap blocks 1404 in FIG. 14 and FIG. 18. From block 2102, flow proceeds to block 2104.

At block 2104, a second decap block is formed, the second decap block including a second decap. Examples of second decap block include decap blocks 204 in FIG. 2 and FIG. 3, decap blocks 404 in FIG. 4, FIG. 5, and FIG. 15, decap blocks 604 in FIG. 6, decap blocks 704 in FIG. 7, FIG. 8, and FIG. 9, decap blocks 1004 in FIG. 10, FIG. 11, FIG. 12, and FIG. 16, decap blocks 1304 in FIG. 13 and FIG. 17 and decap blocks 1404 in FIG. 14 and FIG. 18. From block 2104, flow proceeds to block 2106.

At block 2106, one or more first clock gate blocks are formed, each of the one or more first clock gate blocks include a clock gate. The one or more first clock gate blocks are between the first decap block and the second decap block. Examples of clock gate blocks include clock gate blocks 202 in FIG. 2 and FIG. 3, clock gate blocks 402 in FIG. 4, FIG. 5, and FIG. 15, clock gate blocks 602 in FIG. 6, clock gate blocks 702 in FIG. 7, FIG. 8, and FIG. 9, clock gate blocks 1002 in FIG. 10, FIG. 11, FIG. 12, and FIG. 16, clock gate blocks 1302 in FIG. 13 and FIG. 17 and clock gate blocks 1402 in FIG. 14 and FIG. 18. Examples of clock gate blocks being between decap blocks are provided in cell region 200 in FIG. 2, cell region 300 in FIG. 3, cell region 400 in FIG. 4, cell region 500 in FIG. 5, cell region 600 in FIG. 6, cell region 700 in FIG. 7, cell region 800 in FIG. 8, cell region 900 in FIG. 9, cell region 1000 in FIG. 10, cell region 1100 in FIG. 11, cell region 1210 in FIG. 12, cell region 1300 in FIG. 13, cell region 1400 in FIG. 14, cell region 1500 in FIG. 15, cell region 1600 in FIG. 16, cell region 1700 in FIG. 17, and cell region 1800 in FIG. 18.

Figure 22:
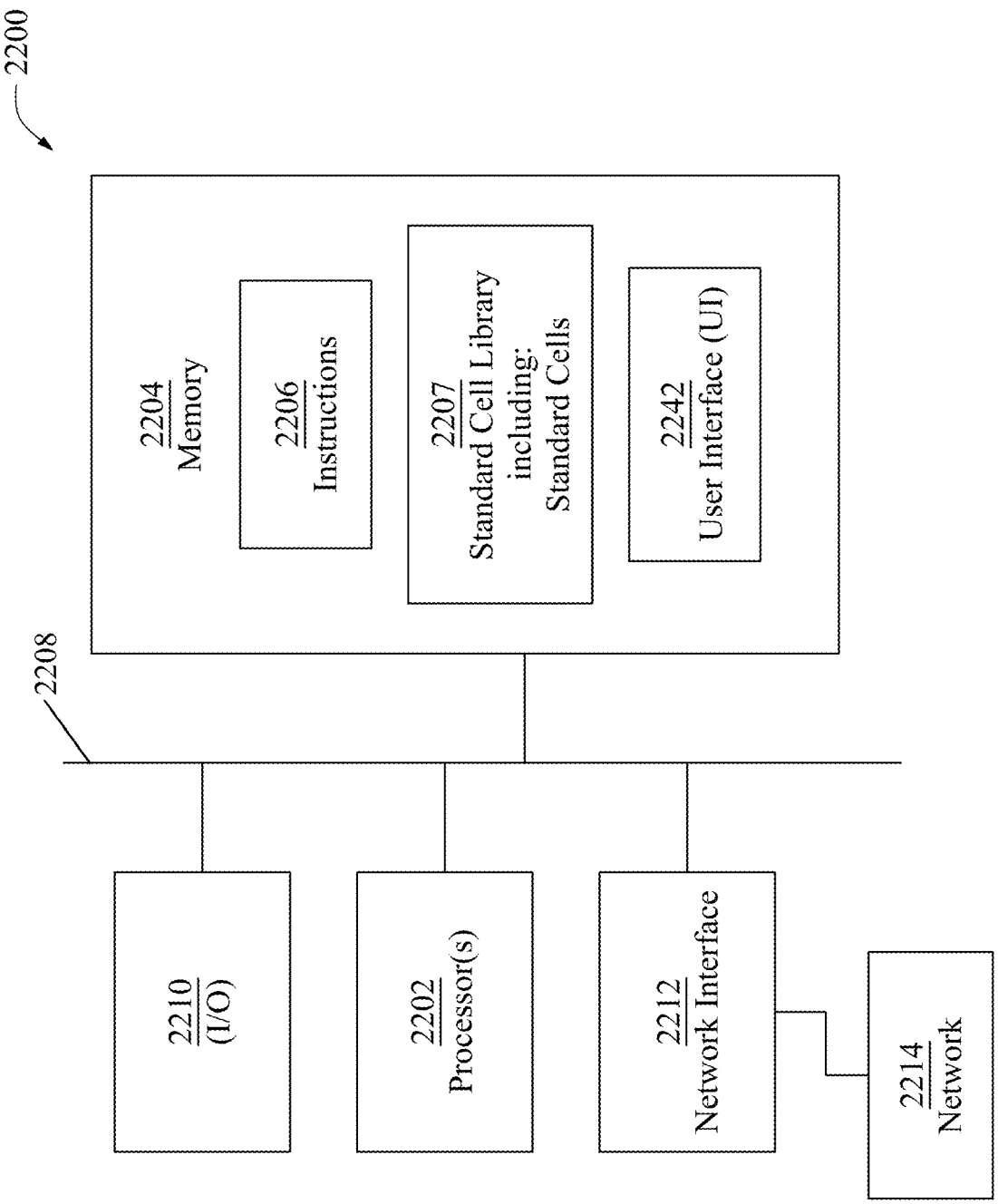
FIG. 22 is a block diagram of an EDA system, in accordance with some embodiments.

FIG. 22 is a block diagram of an EDA system 2200, in accordance with some embodiments.

In some embodiments, EDA system 2200 includes an APR system. Methods described herein of designing layout diagrams, in accordance with one or more embodiments, are implementable, for example, using EDA system 2200, in accordance with some embodiments.

In some embodiments, EDA system 2200 is a general purpose computing device including a hardware processor 2202 and a non-transitory, computer-readable storage medium 2204. Storage medium 2204, amongst other things, is encoded with, i.e., stores, computer program code 2206, i.e., a set of executable instructions. Execution of instructions 2206 by hardware processor 2202 represents (at least in part) an EDA tool which implements a portion or all of the methods described herein in accordance with one or more embodiments (hereinafter, the noted processes and/or methods).

Processor 2202 is electrically coupled to computer-readable storage medium 2204 via a bus 2208. Processor 2202 is also electrically coupled to an I/O interface 2210 by bus 2208. A network interface 2212 is also electrically connected to processor 2202 via bus 2208. Network interface 2212 is connected to a network 2214, so that processor 2202 and computer-readable storage medium 2204 are capable of connecting to external elements via network 2214. Processor 2202 is configured to execute computer program code 2206 encoded in computer-readable storage medium 2204 in order to cause system 2200 to be usable for performing a portion or all of the noted processes and/or methods. In one or more embodiments, processor 2202 is a central processing unit (CPU), a multi-processor, a distributed processing system, an application specific integrated circuit (ASIC), and/or a suitable processing unit.

In one or more embodiments, computer-readable storage medium 2204 is an electronic, magnetic, optical, electromagnetic, infrared, and/or a semiconductor system (or apparatus or device). For example, computer-readable storage medium 2204 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 2204 includes a compact disk-read only memory (CD-ROM), a compact disk-read/write (CD-R/W), and/or a digital video disc (DMD/VD).

In one or more embodiments, storage medium 2204 stores computer program code 2206 configured to cause system 2200 (where such execution represents (at least in part) the EDA tool) to be usable for performing a portion or all of the noted processes and/or methods. In one or more embodiments, storage medium 2204 also stores information which facilitates performing a portion or all of the noted processes and/or methods. In one or more embodiments, storage medium 2204 stores library 2207 of standard cells including such standard cells as disclosed herein. In one or more embodiments, storage medium 2204 stores one or more layout diagrams 2209 corresponding to one or more layouts disclosed herein.

EDA system 2200 includes I/O interface 2210. I/O interface 2210 is coupled to external circuitry. In one or more embodiments, I/O interface 2210 includes a keyboard, keypad, mouse, trackball, trackpad, touchscreen, and/or cursor direction keys for communicating information and commands to processor 2202.

EDA system 2200 also includes network interface 2212 coupled to processor 2202. Network interface 2212 allows system 2200 to communicate with network 2214, to which one or more other computer systems are connected. Network interface 2212 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 2200.

System 2200 is configured to receive information through I/O interface 2210. The information received through I/O interface 2210 includes one or more of instructions, data, design rules, libraries of standard cells, and/or other parameters for processing by processor 2202. The information is transferred to processor 2202 via bus 2208. EDA system 2200 is configured to receive information related to a UI through I/O interface 2210. The information is stored in computer-readable medium 2204 as user interface (UI) 2242.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 2200. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DMD/VD, a magnetic disk, such as a hard disk, a semiconductor memory, such as a ROM, a RAM, a memory card, and the like.

Figure 23:
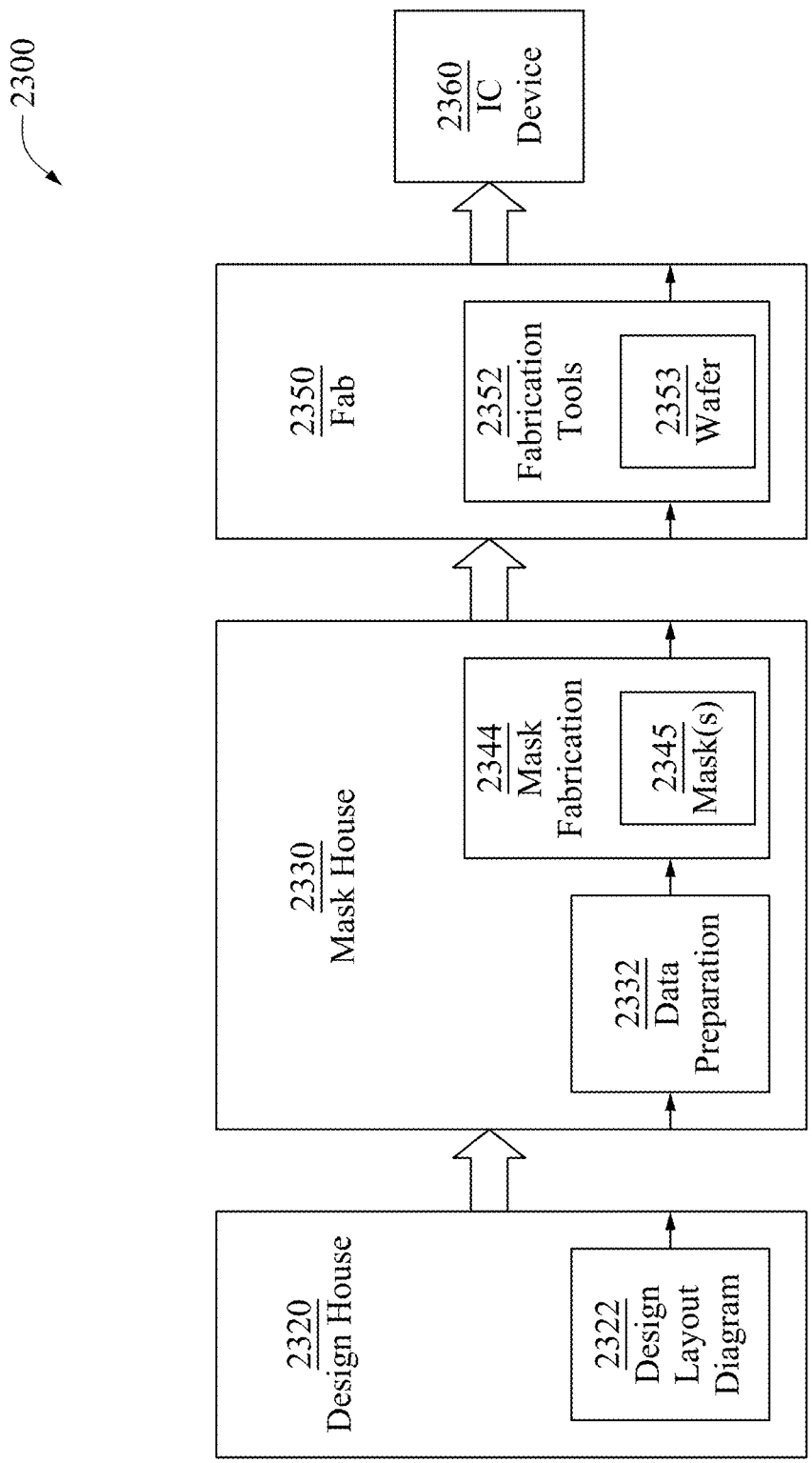
FIG. 23 is a block diagram of an IC manufacturing system, and an IC manufacturing flow associated therewith, in accordance with some embodiments.

FIG. 23 is a block diagram of an IC manufacturing system 2300, and an IC manufacturing flow associated therewith, in accordance with some embodiments.

In some embodiments, based on a layout diagram, e.g., at least one of (A) one or more semiconductor masks or (b) at least one component in a layer of a semiconductor integrated circuit is fabricated using manufacturing system 2300.

In FIG. 23, IC manufacturing system 2300 includes entities, such as a design house 2320, a mask house 2330, and an IC manufacturer/fabricator ("fab") 2350, that interact with one another in the design, development, and manufacturing cycles and/or services related to manufacturing an IC device 2360. The entities in system 2300 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 2320, mask house 2330, and IC fab 2350 is owned by a single larger company. In some embodiments, two or more of design house 2320, mask house 2330, and IC fab 2350 coexist in a common facility and use common resources.

Design house (or design team) 2320 generates an IC design layout diagram 2322. IC design layout diagram 2322 includes various geometrical patterns designed for an IC device 2360. The geometrical patterns correspond to patterns of metal, oxide, or semiconductor layers that make up the various components of IC device 2360 to be fabricated. The various layers combine to form various IC features. For example, a portion of IC design layout diagram 2322 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 2320 implements a proper design procedure to form IC design layout diagram 2322. The design procedure includes one or more of logic design, physical design or place and route. IC design layout diagram 2322 is presented in one or more data files having information of the geometrical patterns. For example, IC design layout diagram 2322 is expressed in a GDSII file format or DFII file format.

Mask house 2330 includes data preparation 2332 and mask fabrication 2344. Mask house 2330 uses IC design layout diagram 2322 to manufacture one or more masks 2345 to be used for fabricating the various layers of IC device 2360 according to IC design layout diagram 2322. Mask house 2330 performs mask data preparation 2332, where IC design layout diagram 2322 is translated into a representative data file ("RDF"). Mask data preparation 2332 provides the RDF to mask fabrication 2344. Mask fabrication 2344 includes a mask writer. A mask writer converts the RDF to an image on a substrate, such as a mask (reticle) 2345 or a semiconductor wafer 2353. The design layout diagram 2322 is manipulated by mask data preparation 2332 to comply with particular characteristics of the mask writer and/or requirements of IC fab 2350. In FIG. 23, mask data preparation 2332 and mask fabrication 2344 are illustrated as separate elements. In some embodiments, mask data preparation 2332 and mask fabrication 2344 is collectively referred to as mask data preparation.

In some embodiments, mask data preparation 2332 includes optical proximity correction (OPC) which uses lithography enhancement techniques to compensate for image errors, such as those that can arise from diffraction, interference, other process effects and the like. OPC adjusts IC design layout diagram 2322. In some embodiments, mask data preparation 2332 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 2332 includes a mask rule checker (MRC) that checks the IC design layout diagram 2322 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 2322 to compensate for limitations during mask fabrication 2344, which may undo part of the modifications performed by OPC in order to meet mask creation rules.

In some embodiments, mask data preparation 2332 includes lithography process checking (LPC) that simulates processing that will be implemented by IC fab 2350 to fabricate IC device 2360. LPC simulates this processing based on IC design layout diagram 2322 to create a simulated manufactured device, such as IC device 2360. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus (DOF), mask error enhancement factor (MEEF), other suitable factors, and the like or combinations thereof. In some embodiments, after a simulated manufactured device has been created by LPC, if the simulated device is not close enough in shape to satisfy design rules, OPC and/or MRC are repeated to further refine IC design layout diagram 2322.

It should be understood that the above description of mask data preparation 2332 has been simplified for the purposes of clarity. In some embodiments, data preparation 2332 includes additional features such as a logic operation (LOP) to modify the IC design layout diagram 2322 according to manufacturing rules. Additionally, the processes applied to IC design layout diagram 2322 during data preparation 2332 may be executed in a variety of different orders.

After mask data preparation 2332 and during mask fabrication 2344, a mask 2345 or a group of masks 2345 are fabricated based on the modified IC design layout diagram 2322. In some embodiments, mask fabrication 2344 includes performing one or more lithographic exposures based on IC design layout diagram 2322. In some embodiments, an electron-beam (e-beam) or a mechanism of multiple e-beams is used to form a pattern on a mask (photomask or reticle) 2345 based on the modified IC design layout diagram 2322. Mask 2345 is formed in various technologies. In some embodiments, mask 2345 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 2345 includes a transparent substrate (e.g., fused quartz) and an opaque material (e.g., chromium) coated in the opaque regions of the binary mask. In another example, mask 2345 is formed using a phase shift technology. In a phase shift mask (PSM) version of mask 2345, various features in the pattern formed on the phase shift mask are configured to have proper phase difference to enhance the resolution and imaging quality. In various examples, the phase shift mask is attenuated PSM or alternating PSM. The mask(s) generated by mask fabrication 2344 is used in a variety of processes. For example, such a mask(s) is used in an ion implantation process to form various doped regions in semiconductor wafer 2353, in an etching process to form various etching regions in semiconductor wafer 2353, and/or in other suitable processes.

IC fab 2350 is an IC fabrication business that includes one or more manufacturing facilities for the fabrication of a variety of different IC products. In some embodiments, IC Fab 2350 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 2350 includes fabrication tools 2352 configured to execute various manufacturing operations on semiconductor wafer 2353 such that IC device 2360 is fabricated in accordance with the mask(s), e.g., mask 2345. In various embodiments, fabrication tools 2352 include one or more of a wafer stepper, an ion implanter, a photoresist coater, a process chamber, e.g., a CMD/VD chamber or LPCMD/VD furnace, a CMP system, a plasma etch system, a wafer cleaning system, or other manufacturing equipment capable of performing one or more suitable manufacturing processes as discussed herein.

IC fab 2350 uses mask(s) 2345 fabricated by mask house 2330 to fabricate IC device 2360. Thus, IC fab 2350 at least indirectly uses IC design layout diagram 2322 to fabricate IC device 2360. In some embodiments, semiconductor wafer 2353 is fabricated by IC fab 2350 using mask(s) 2345 to form IC device 2360. In some embodiments, the IC fabrication includes performing one or more lithographic exposures based at least indirectly on IC design layout diagram 2322. Semiconductor wafer 2353 includes a silicon substrate or other proper substrate having material layers formed thereon. Semiconductor wafer 2353 further includes one or more of various doped regions, dielectric features, multi-level interconnects, and the like (formed at subsequent manufacturing steps).

Details regarding an integrated circuit (IC) manufacturing system (e.g., system 2300 of FIG. 23), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

In some embodiments, a semiconductor device having a cell region, the cell region includes: a first set of one or more first blocks, each of the first blocks including a clock gate; a second set of one or more second blocks, each of the second blocks including a decoupling capacitor; and wherein: at least one of: the first set has two or more first blocks; or the second set has two or more second blocks; and the first blocks of the first set are interleaved with the second blocks of the second set. In some embodiments, the first blocks of the first set are interleaved with the second blocks of the second set such that: the first blocks of the first set and the second blocks of the second set are arranged in a row of blocks with respect to a first direction; and either: each odd-numbered block in the row is a corresponding one of the first blocks and each even-numbered block in the row is a corresponding one of the second blocks; or each even-numbered block in the row is a corresponding one of the first blocks and each odd-numbered block in the row is a corresponding one of the second blocks. In some embodiments, the semiconductor device further includes: a first metal layer formed over the row of blocks; and wherein: the first metal layer has first conductors; each of the first conductors has a long axis that extends in a second direction; the second direction is perpendicular to the first direction; and each of the first conductors extends over a corresponding one of the blocks in the row of blocks. In some embodiments, the first blocks of the first set are interleaved with the second blocks of the second set such that: the first blocks of the first set and the second blocks of the second set are arranged in rows with respect to a first direction and columns with respect to a second direction, wherein the second direction is perpendicular to the first direction; for the rows of blocks, either: each odd-numbered block in the row is a corresponding one of the first blocks and each even-numbered block in the row is a corresponding one of the second blocks; or each even-numbered block in the row is a corresponding one of the first blocks and each odd-numbered block in the row is a corresponding one of the second blocks; for each column of the columns of blocks, either: each odd-numbered block in the column is a corresponding one of the first blocks and each even-numbered block in the column is a corresponding one of the second blocks; or each even-numbered block in the column is a corresponding one of the first blocks and each odd-numbered block in the column is a corresponding one of the second blocks.

In some embodiments, the semiconductor device further includes: a first metal layer formed over the row of blocks; and wherein: the first metal layer has first conductors; each of the first conductors has a long axis that extends in the second direction; and for each of the columns of blocks, each of the first conductors extends over a corresponding one of the blocks in the column. In some embodiments, the first set of first blocks are interleaved with the second set of one or more second blocks such that: the first set of first blocks and the second set of one or more second blocks form a row of blocks with respect to a first direction; and first groups of adjacent first blocks of the first set are interleaved with second groups of adjacent second blocks of the second set. In some embodiments, the semiconductor device, further includes a first metal layer over the row of blocks; and a second metal layer over the row of blocks; and wherein: the first metal layer has first conductors; the second metal layer has second conductors; each of the first conductors has a long axis that extends in the first direction; each of the second conductors has a long axis that extends in the second direction; each of the first conductors extends over a corresponding one of the first groups of adjacent first blocks of the first set; and each of the second conductors extends over a corresponding first block of the first set. In some embodiments, the semiconductor device further includes: a first metal layer over the row of blocks; and a second metal layer over the row of blocks; and wherein: the first metal layer has first conductors; the second metal layer has second conductors; each of the first conductors has a long axis that extends in the first direction; each of the second conductors has a long axis that extends in the second direction; each of the first conductors extends over the row of blocks; and each of the second conductors extends over a corresponding block of the row of blocks. In some embodiments, the first blocks of the first set are interleaved with the second blocks of the second set such that: the first blocks of the first set and the second blocks of the second set are arranged in rows with respect to a first direction and columns with respect to a second direction, wherein the second direction is perpendicular to the first direction; for the rows of blocks, either: each odd-numbered block in the row is a corresponding one of the first blocks and each even-numbered block in the row is a corresponding one of the second blocks; or each even-numbered block in the row is a corresponding one of the first blocks and each odd-numbered block in the row is a corresponding one of the second blocks; for the columns of blocks, either: each odd-numbered column of the columns of blocks only includes blocks from the first set of first blocks and each even-numbered column of the columns of blocks only includes blocks from the second set of one or more second blocks; or each even-numbered column of the columns of blocks only includes blocks from the first set of first blocks and each odd-numbered column of the columns of blocks only includes blocks from the second set of one or more second blocks. In some embodiments, the first blocks of the first set are interleaved with the second blocks of the second set such that: the first blocks of the first set and the second blocks of the second set are arranged in rows with respect to a first direction and columns with respect to a second direction, wherein the second direction is perpendicular to the first direction; for each column of the columns of blocks, either: each odd-numbered block in the column is a corresponding one of the first blocks and each even-numbered block in the column is a corresponding one of the second blocks; or each even-numbered block in the column is a corresponding one of the first blocks and each odd-numbered block in the column is a corresponding one of the second blocks; and for the rows of blocks, either: each odd-numbered row of the rows of blocks only includes blocks from the first set of first blocks and each even-numbered row only includes blocks from the second set of one or more second blocks; or each even-numbered row of the rows of blocks only includes blocks from the first set of first blocks and each odd-numbered row only includes blocks from the second set of one or more second blocks. In some embodiments, the first blocks of the first set are interleaved with the second blocks of the second set such that: the first blocks of the first set and the second blocks of the second set are arranged in rows with respect to a first direction and columns with respect to a second direction, wherein the second direction is perpendicular to the first direction; for the rows of blocks, either: each odd-numbered row of the rows of blocks only includes blocks from the first set of one or more first blocks and each even-numbered row of the rows of blocks only includes blocks from the second set of one or more second blocks; or each even-numbered row of the rows of blocks only includes blocks from the first set of one or more first blocks and each odd-numbered row of the rows of blocks only includes blocks from the second set of one or more second blocks; and for each column of the columns of blocks, either: each odd-numbered block in the column is a corresponding one of the first blocks and each even-numbered block in the column is a corresponding one of the second blocks; or each even-numbered block in the column is a corresponding one of the first blocks and each odd-numbered block in the column is a corresponding one of the second blocks. In some embodiments, the first blocks of the first set are interleaved with the second blocks of the second set such that: the first blocks of the first set and the second blocks of the second set are arranged in rows with respect to a first direction and columns with respect to a second direction, wherein the second direction is perpendicular to the first direction; within the rows of blocks, first groups of adjacent first blocks of the first set are interleaved with second groups of adjacent second blocks of the second set; within each column of the columns of blocks, the first groups of adjacent first blocks of the first set are interleaved with the second groups of adjacent second blocks of the second set. In some embodiments, the semiconductor device, further includes a first metal layer and a second metal layer, wherein: the first metal layer and the second metal layer are formed over the rows and columns of blocks; the first metal layer has first conductors; the second metal layer has second conductors; each of the first conductors has a long axis that extends in the first direction; each of the second conductors has a long axis that extends in the second direction; each of the first conductors extends over a corresponding one of the first groups of adjacent first blocks of the first set; each of the second conductors extends over a corresponding one of the columns of blocks. In some embodiments, the semiconductor device, further includes a first metal layer and a second metal layer, wherein: the first metal layer and the second metal layer are formed over the rows and columns of blocks; the first metal layer has first conductors; the second metal layer has second conductors; each of the first conductors has a long axis that extends in the first direction; each of the second conductors has a long axis that extends in the second direction; each of the first conductors extends over a corresponding one of the rows of blocks; each of the second conductors extends over a corresponding one of the columns of blocks. In some embodiments, the semiconductor device further includes: a first substrate layer that includes the first set of first blocks and the second set of second blocks; a second substrate layer formed beneath the first substrate layer, the second substrate layer including a third set of third blocks and a fourth set of fourth blocks; and wherein: each third block in the third set includes a clock gate; each fourth block in the fourth set includes a decoupling capacitor; and wherein: at least one of: the third set has two or more third blocks; or the fourth set has two or more fourth blocks; and the third blocks of the third set are interleaved with the fourth blocks of the fourth set.

In some embodiments, a semiconductor device having a cell region, the cell region includes: a first clock gate block, the first clock gate block including a first clock gate; a second clock gate block, the second clock gate block including a second clock gate; one or more first decoupling capacitor blocks, each of the one or more first decoupling capacitor blocks including a decoupling capacitor; and wherein the one or more first decoupling capacitor blocks are between the first clock gate block and the second clock gate block. In some embodiments, the first clock gate block, the second clock gate block and the one or more first decoupling capacitor blocks are arranged in a first row of blocks within the cell region. In some embodiments, the semiconductor device further includes: a second row of blocks adjacent to the first row of blocks, wherein the second row of blocks includes: a third clock gate block, the third clock gate block including a third clock gate; a fourth clock gate block, the fourth clock gate block including a fourth clock gate; one or more second decoupling capacitor blocks, each of the one or more second decoupling capacitor blocks including a decoupling capacitor; and wherein the one or more second decoupling capacitor blocks are between the third clock gate block and the fourth clock gate block. In some embodiments, the first clock gate block, the second clock gate block, and the one or more first decoupling capacitor blocks are arranged in a first column of blocks within the cell region. In some embodiments, the semiconductor device further includes: a second column of blocks adjacent to the first column of blocks, the second column of blocks including: a third clock gate block, the third clock gate block including a third clock gate; a fourth clock gate block, the fourth clock gate block including a fourth clock gate; one or more second decoupling capacitor blocks, each of the one or more second decoupling capacitor blocks including a decoupling capacitor; and wherein the one or more second decoupling capacitor blocks are between the third clock gate block and the fourth clock gate block.

In some embodiments, a method of fabricating a semiconductor device having a cell region, the method includes: forming a first decoupling capacitor block within the cell region, the first decoupling capacitor block including a first decoupling capacitor; forming a second decoupling capacitor block, the second decoupling capacitor block including a second decoupling capacitor; and forming one or more first clock gate blocks, each of the one or more clock gate blocks including a clock gate, wherein the one or more first clock gate blocks are between the first decoupling capacitor block and the second decoupling capacitor block.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device having a cell region, the cell region comprising:
   a first set of one or more substantially uniformly sized first blocks, each of the first blocks including a clock gate; and
   a second set of one or more substantially uniformly sized second blocks, each of the second blocks including a decoupling capacitor,
   wherein:
      first groups of adjacent ones of the first blocks of the first set are interleaved with second groups of adjacent ones of the second blocks of the second set into (A) columns and one or more rows or (B) rows and one or more columns;
      each of the first groups has a pair of corresponding adjacent ones of the first blocks of the first set; and
      each of the second groups has a pair of corresponding adjacent ones of the second blocks of the second set.

2. The semiconductor device of claim 1, wherein:
   the first groups of adjacent first blocks of the first set are interleaved with the second groups of adjacent second blocks of the second set in each of the one or more rows.

3. The semiconductor device of claim 2, the cell region further comprising:
   a first metal layer over the one or more rows; and
   a second metal layer over the first metal layer,
   wherein:
      the first metal layer has first conductors;
      the second metal layer has second conductors;
      each of the first conductors has a long axis that extends in a first direction;
      each of the second conductors has a long axis that extends in a second direction that is perpendicular to the first direction;
      each of the first conductors extends over a corresponding one of the first groups of adjacent first blocks; and
      each of the second conductors extends over a corresponding first block.

4. The semiconductor device of claim 2, the cell region further comprising:
   a first metal layer over the one or more rows; and
   a second metal layer over the first metal layer,
   wherein:
      the first metal layer has first conductors;
      the second metal layer has second conductors;
      each of the first conductors has a long axis that extends in a first direction;
      each of the second conductors has a long axis that extends in a second direction that is perpendicular to the first direction;
      each of the first conductors extends over the row of blocks; and
      each of the second conductors extends over a corresponding block of the row of blocks.

5. The semiconductor device of claim 1, wherein: the first blocks of the first set are interleaved with the second blocks of the second set such that:
within each row of the one or more rows of blocks, first groups of adjacent first blocks of the first set are interleaved with second groups of adjacent second blocks of the second set; and
within each column of the one or more columns of blocks, the first groups of adjacent first blocks of the first set are interleaved with the second groups of adjacent second blocks of the second set.

6. The semiconductor device of claim 5, the cell region further comprising:
a first metal layer, and
a second metal layer, and
wherein:
the first metal layer and the second metal layer are formed over the rows and columns of blocks;
the first metal layer has first conductors;
the second metal layer has second conductors;
each of the first conductors has a long axis that extends in a first direction;
each of the second conductors has a long axis that extends in a second direction perpendicular to the first direction;
each of the first conductors extends over a corresponding one of the first groups of adjacent first blocks of the first set; and
each of the second conductors extends over a corresponding one of the columns of blocks.

7. The semiconductor device of claim 5, the cell region further comprising:
a first metal layer; and
a second metal layer,
wherein:
the first metal layer and the second metal layer are formed over the rows and columns of blocks;
the first metal layer has first conductors;
the second metal layer has second conductors;
each of the first conductors has a long axis that extends in a first direction;
each of the second conductors has a long axis that extends in a second direction perpendicular to the first direction;
each of the first conductors extends over a corresponding one of the rows of blocks; and
each of the second conductors extends over a corresponding one of the columns of blocks.

8. A semiconductor device having a cell region, the cell region comprising:
first groups of substantially uniformly sized clock gate blocks, each first group including:
a first clock gate block, the first clock gate block including a first clock gate; and
a second clock gate block, the second clock gate block including a second clock gate;
second groups of substantially uniformly sized decoupling capacitor (decap) blocks interleaved with the first groups into (A) columns and one or more rows or (B) rows and one or more columns, each second group including:
a first decap block, the first decap block including a first decoupling capacitor; and
a second decap block, the second decap block including a second decoupling capacitor;
a first metal layer over the clock gate blocks and the decap blocks; and
a second metal layer over the first metal layer,
wherein:
the first metal layer havs first conductors;
the second metal layer has second conductors;
each of the first conductors havs a long axis extending in a first direction;
each of the second conductors has a long axis extending in a second direction that is perpendicular to the first direction; and
for each of the first clock ggate and decap blocks and the second clock gate and decap blocks,
a corresponding one of the first conductors extends thereover; or
a corresponding one of the second conductors extends thereover.

9. A method of fabricating a semiconductor device having a cell region, the method comprising:
forming pairs of substantially uniformly sized decoupling capacitor (decap) blocks within the cell region, each of the decap blocks including a corresponding decoupling capacitor;
forming pairs of substantially uniformly sized clock gate blocks, each of the clock gate blocks including a clock gate; and
arranging the one or more substantially uniformly sized clock gate blocks to be interleaved with the decap blocks into (A) columns and one or more rows or (B) rows and one or more columns.

10. The semiconductor device of claim 3, wherein:
for each of the first conductors, a first end of the first conductor extends beyond a first side of a corresponding one of the first groups of adjacent first blocks of the first set over a first adjacent one of the second blocks; and
for each of the first conductors, a second end of the first conductor extends beyond a second side of the corresponding one of the first groups of adjacent first blocks of the first set over a second adjacent one of the second blocks.

11. The semiconductor device of claim 10, wherein:
for each of the first conductors, the first end of the first conductor extends substantially beyond the first adjacent one of the second blocks into a third one of the second blocks, the third one of the second blocks being adjacent to the first adjacent one of the second blocks; and
for each of the first conductors, the second end of the first conductor extends substantially beyond the second adjacent one of the second blocks into a fourth one of the second blocks, the fourth one of the second blocks being adjacent to the second adjacent one of the second blocks.

12. The semiconductor device of claim 6, wherein:
for each of the first conductors, a first end of the first conductor extends substantially beyond a first side of a corresponding one of the first groups of adjacent first blocks of the first set; and
for each of the first conductors, a second end of the first conductor extends substantially beyond a second side of the corresponding one of the first groups of adjacent first blocks of the first set.

13. The semiconductor device of claim 2, wherein:
positions of first groups in a first row of the one or more rows are offset from positions of first groups in a second row of the one or more rows; and positions of second groups in the first row are offset from positions of second group in the second row.

14. The semiconductor device of claim 3, wherein:
for each of the first blocks and the second blocks, a corresponding one of the first conductors extends thereover.

15. The semiconductor device of claim 4, wherein:
for each of the first blocks and the second blocks, a corresponding one of the second conductors extends thereover.

16. The semiconductor device of claim 15, wherein:
for each of the first blocks, two corresponding ones of the second conductors extend thereover.

17. The semiconductor device of claim 8, wherein:
for each of the first groups of the first clock gate block and the second clock gatge block,
    a corresponding one of the first conductors extends thereover; and
    a corresponding one of the second conductors extends thereover.

18. The semiconductor device of claim 8, wherein:
for each of the first groups of the first clock gate block and the second clock gate block, two corresponding ones of the second conductors extend thereover.

19. The method of claim 9, further comprising:
in a first metal layer over the clock gate blocks and the decap blocks,
    forming first conductors extending in a first direction; and
in a second metal layer over the first metal layer,
    forming second conductors extending in a second direction that is perpendicular to the first direction,
wherein:
for each of the first blocks and the second blocks, at least one of the following:
    the forming first conductors includes forming a sufficient quantity of the first conductors so that a corresponding one of the first conductors extends over each of the clock gate blocks and the decap blocks; or
    the forming second conductors includes forming a sufficient quantity of the second conductors so that a corresponding one of the second conductors extends over each of the clock gate blocks and the decap blocks.

20. The method of claim 19, wherein:
for each of the clock gate blocks and the decap blocks, at least one of the following:
    the forming first conductors includes forming a sufficient quantity of the first conductors so that a corresponding one of the first conductors extends over each of the clock gate blocks and the decap blocks; and
    the forming second conductors includes forming a sufficient quantity of the second conductors so that two corresponding ones of the second conductors extend over each of the clock gate blocks.

* * * * *